(12) United States Patent
Spadea

(10) Patent No.: US 7,075,140 B2
(45) Date of Patent: Jul. 11, 2006

(54) LOW VOLTAGE EEPROM MEMORY ARRAYS

(76) Inventor: Gregorio Spadea, 18600 Perego Way, Saratoga, CA (US) 95070

( * ) Notice: Subject to any disclaimer, the term of this patent is extended or adjusted under 35 U.S.C. 154(b) by 59 days.

(21) Appl. No.: 10/896,152

(22) Filed: Jul. 20, 2004

(65) Prior Publication Data
US 2005/0110073 A1    May 26, 2005

Related U.S. Application Data

(60) Provisional application No. 60/525,580, filed on Nov. 26, 2003.

(51) Int. Cl.
*H01L 29/788* (2006.01)

(52) U.S. Cl. .............................. 257/315; 438/5; 438/10; 438/17; 438/130; 438/466; 257/E21.682; 257/E27.103; 365/145

(58) Field of Classification Search ........ 257/E21.682, 257/E27.103; 438/5, 6, 10, 17, 130, 466; 365/145
See application file for complete search history.

(56) References Cited

U.S. PATENT DOCUMENTS

| | | |
|---|---|---|
| 6,201,732 B1 | 3/2001 | Caywood |
| 6,310,800 B1 | 10/2001 | Takahashi |
| 6,404,681 B1 | 6/2002 | Hirano |
| 6,438,030 B1 | 8/2002 | Hu et al. |
| 6,451,652 B1 | 9/2002 | Caywood et al. |
| 6,606,265 B1 | 8/2003 | Bergemont et al. |
| 6,649,453 B1 * | 11/2003 | Chen et al. .................. 438/130 |
| 2001/0000306 A1 | 4/2001 | Yoon et al. |

FOREIGN PATENT DOCUMENTS

DE     198 23 733 A 1     12/1999

OTHER PUBLICATIONS

Chi-nan Brian Li et al., "A Novel Uniform-Channel-Program-Erase (UCPE) Flash EEPROM Using An Isolated P-well Structure," IEDM 2000, pp. 33.5.1-33.5.4.
International Search Report, 6 pages.

* cited by examiner

*Primary Examiner*—Mai-Huong Tran
(74) *Attorney, Agent, or Firm*—Patent Law Group LLP; Carmen C. Cook

(57) ABSTRACT

A non-volatile memory array includes memory cells connected in a common source arrangement and formed in columns of isolated well regions so that Fowler-Nordheim tunneling is used for both write and erase operations of the memory cells. The memory arrays can be formed as NOR arrays or NAND arrays. In one embodiment, the memory array of the present invention is formed as a byte alterable EEPROM with parallel access. In another embodiment, an insulated gate bipolar transistor (IGBT) is coupled to the memory cells to increase the cell read current of the memory array. When the memory array incorporates IGBTs on the bitlines, the cell read current becomes independent of the wordline voltages. Thus, the memory array of the present invention can be operated at low voltages. The use of IGBTs in the memory array of the present invention enables formation of embedded non-volatile memories in low-voltage digital integrated circuits.

21 Claims, 25 Drawing Sheets

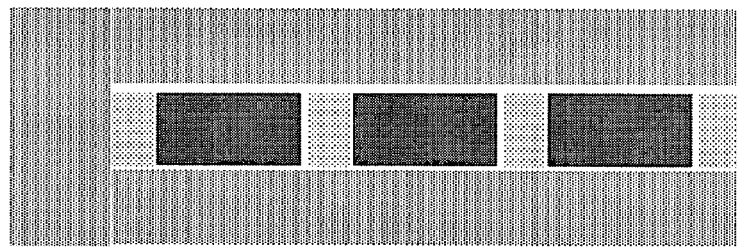
Fig. 6E
Fig. 7A
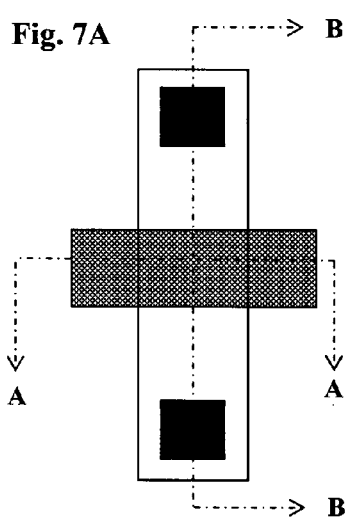
Fig. 7B
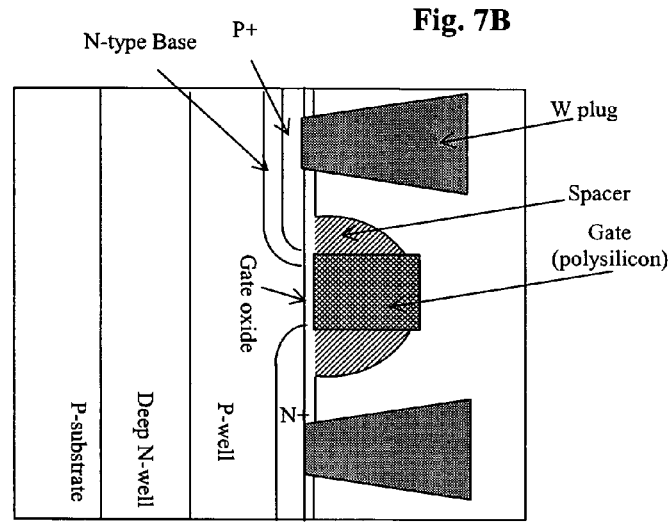
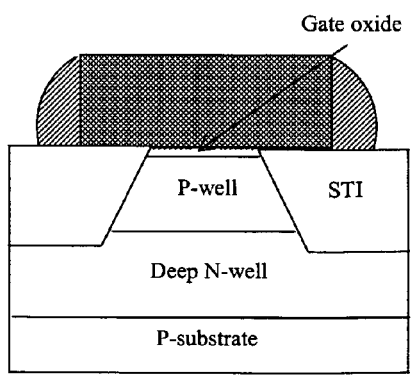
Fig. 7C
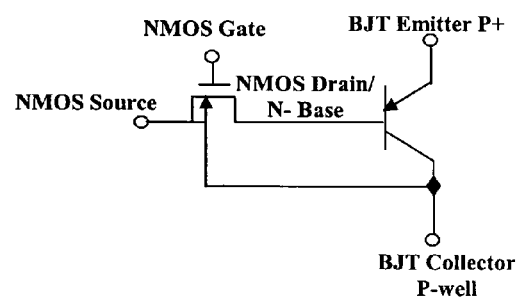
Fig. 7D

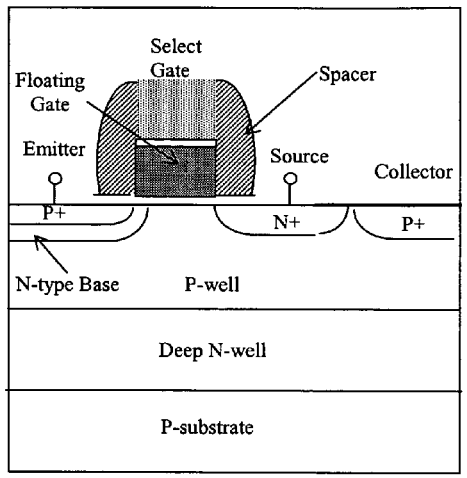
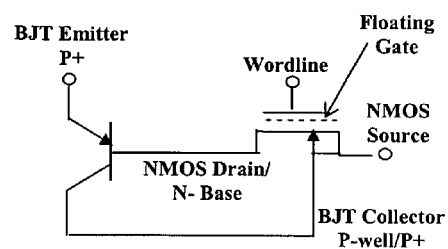
Fig. 8A
Fig. 8B
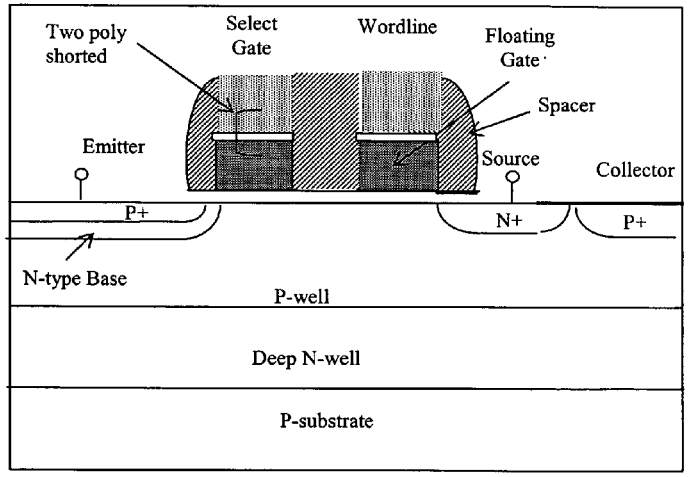
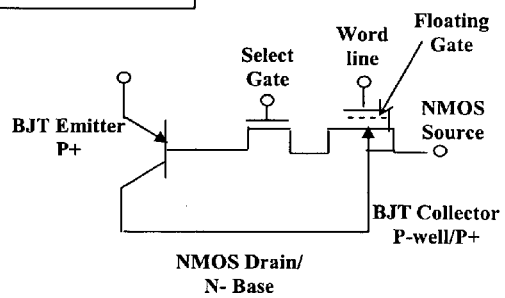
Fig. 9A
Fig. 9B

Self-aligned Stacked Gate Cell

Area = 0.228 um²

Cell with Separate Gates

Area = 0.228 um²

LOW VOLTAGE EEPROM MEMORY ARRAYS

CROSS-REFERENCE TO RELATED APPLICATIONS

This application claims the benefit of U.S. Provisional Patent Application Ser. No. 60/525,580, filed on Nov. 26, 2003, having the same inventorship hereof, which application is incorporated herein by reference in its entirety.

FIELD OF THE INVENTION

The invention relates to semiconductor non-volatile memories and, in particular, to EEPROM memory cells and memory arrays capable of write and erase operations with low power consumption.

DESCRIPTION OF THE RELATED ART

Non-volatile memory devices and electrically erasable programmable read only memory (EEPROM) devices are known. In many applications, it is desirable to embed non-volatile memory blocks into low voltage digital integrated circuits. The technology for manufacturing low voltage digital integrated circuits is well established in the industry. Thus, a non-volatile memory that can be operated at a low voltage and with low power for programming and at a high speed is desired.

The dominant technology used for non-volatile memories is memory cells using floating gates. Information is stored in the floating gate by charging or discharging the floating gate. The transfer of electrons to and out of the floating gate is usually based on hot electrons injection or Fowler-Nordheim (FN) tunneling. There are several features of the conventional non-volatile memories that limit their application as embedded memories in an integrated circuit. First, one class of conventional non-volatile memories often employ channel hot electron injection for program (write), thereby requiring a high current and, consequently, high power consumption for the operation. This problems is solved in another class of conventional memories by using FN tunneling for write and erase and each memory cell, but this solution creates another shortcoming, since, as explained later, each memory cell in a row requires a bitline and a source line which cannot be shared with the neighboring cells. Both the bitline and the source line are made with metal. The use of two vertical metal lines makes it difficult to reduce the cell size of the memory cells.

The use of a common source in nonvolatile memory arrays is widespread and the motivation is the reduction of the size of the memory cell. When common source is used, only one vertical metal line, the bitline, is required as the conductor connecting the source, either a diffusion or a metal line, can run in the horizontal direction in the array. FIG. 1 is a schematic of a conventional common source non-volatile memory array.

Referring to FIG. 1, the memory cell in the array is formed using a self-aligned stacked gate (floating gate and control gate) but a split gate cell (where the control gate overlap one or both edges of the floating gate) can also be used. For a common source array such as the array shown in FIG. 1, writing (injecting electrons into the floating gate) is done by hot carrier injection and erasing (emission of electrons out of the floating gate) is done by FN tunneling. In the common source memory array of FIG. 1, FN tunneling cannot be used for writing because when writing, the memory transistor (and the control gate in the case of the split gate cell) are turned on and the bitlines cannot be at different potentials otherwise a leakage path between the selected and the non-selected cells in the same row of the array is formed if the cells share a common source line.

FIG. 2 illustrates another configuration of a non-volatile memory array where separate vertical source lines and bitlines are used. In the memory array of FIG. 2, FN tunneling can be used for write and erase but at the expense of a larger width of the memory cell due to the presence of two vertical metal lines for each memory cell. Using two vertical metal lines can almost double the size of the memory cell.

U.S. Pat. No. 6,201,732 and U.S. Pat. No. 6,438,030 each describes a NOR memory array where FN tunneling through tunnel oxide grown over the channel of the memory transistor is used for both write and erase operations. The '732 patent describes a memory cell using split gate with a select transistor built on each cell. The '030 patent describes a single transistor memory cell formed with stacked gate. In both cases, writing of the cell (setting the threshold voltage high) is done selectively and erasing (setting the threshold voltage low) is done non-selectively. In both cases, the memory cell has a separate drain line (the bitline) and a separate source line running vertically through the array. In the '030 patent, the source of each memory cell is tied to the p-wells which limits the use of the array as a true common source array.

Another problem common to non-volatile memory cells based on the floating gate concept is the formation of the control gate. In single transistor memory cells, the self-aligned stacked gate process is typically used. This requires a critical masking and etching operation in addition to the masking and etching operation done for defining the gates of the peripheral transistors. For split gate cells a single mask could be used for defining the control gates and the gates of the peripheral transistors, but this is not done in practice for advanced CMOS technologies with feature sizes of 0.25 um and less. For the small feature size technologies, a second problem is created by the height of the stack made with the floating gate and the control gate in a stack gate arrangement which could be excessive and could create potential shorts to the first level of metal. In addition, for the self-aligned stacked gate cell, the gate coupling ratio (the ratio of the capacitance between the floating gate and the control gate and the total capacitance of the floating gate) cannot be easily increased without increasing the size of the cell.

Another common problem encountered in conventional non-volatile memory arrays is the amount of cell current which can be obtained from the memory cell during read. As the dimensions of the memory cells based on the floating gate concept and the supply voltages are reduced, the amount of current available for reading an "on" cell is continuously reduced. The low cell read current condition is true for single transistor and split gate cells. There are several reasons such as the non-scalability of the thickness of the tunnel oxide and the need for the select transistors to be able to sustain high voltages on all terminals during write and erase. A simple mechanism for increasing the cell read current with little or no penalty on the cell size is highly desirable.

A non-volatile memory array which overcomes the limitations of the conventional arrays is desired.

SUMMARY OF THE INVENTION

According to one aspect of the present invention, a non-volatile memory array includes memory cells formed in columns of isolated well regions and connected in a common source arrangement so that Fowler-Nordheim (FN) tunneling is used for both program (write) and erase operations of the memory cells. According to another aspect of the present invention a group of memory cells can be connected in series as it is done in NAND arrays but such array can be used as a byte alterable EEPROM with parallel access as a conventional NOR array. Furthermore, in another embodiment, an insulated gate bipolar transistor (IGBT) is coupled to the memory cells to increase the cell read current of the memory array. When the memory array incorporates IGBTs on the bitlines, the cell read current becomes independent of the wordline voltages. Thus, the memory array of the present invention can be operated at lower voltages than in the case when such IGBT is not present. The use of the IGBTs in the memory array of the present invention enables formation of embedded non-volatile memories in digital integrated circuits which operate from power supply voltages as low as 1.0 Volt.

According to one embodiment of the present invention, a non-volatile memory array including memory cells arranged in rows and columns is described. The memory array includes multiple control lines each associated with one of the rows of the memory array, multiple bitlines each associated with one of the columns of the memory array, multiple source lines each associated with a group of the columns of the memory array, and multiple well regions of a first conductivity type formed in a semiconductor layer of a second conductivity type where each well region is spaced apart and electrically isolated.

In one embodiment, the memory array includes memory cells arranged in rows and columns where each column of memory cells is positioned within one of the well regions and the columns of the memory cells are divided into groups. Each memory cell includes a memory transistor formed in the respective well region and a control/select gate coupled between a respective control line and the floating gate of the memory transistor. The memory transistor includes a source, a drain, and a floating gate formed over a channel of the memory transistor. The drain of the memory transistor is coupled to a respective bitline, and the sources of the memory transistors in each group of memory cells are connected together and to a respective source line. The sources of the memory transistors in each group of memory cells are electrically isolated from the sources of the memory transistors in the other groups of memory cells and each source forms a p-n junction with the respective underlying well region. Each memory cell in the memory array is programmed and erased by tunneling of electrons between the floating gate and the channel of each memory transistor.

In another embodiment, the memory array includes memory cells arranged in rows and columns where each column of memory cells is positioned within one of the well regions. The columns of the memory cells are divided into groups and the rows of the memory cells being divided into sectors. Each memory cell includes a memory transistor formed in the respective well region where the memory transistor includes a source, a drain, and a floating gate formed over a channel of the memory transistor and a control/select gate coupled between a respective control line and the floating gate of the memory transistor. The memory array further includes drain select transistors and drain select lines. Each drain select transistor is provided for a sector of memory cells in each column of memory cells and having a drain coupled to a respective bitline, a source and a gate, the gate of each drain select transistor being coupled to a respective drain select line.

Finally, the memory array includes source select transistors and source select lines. Each source select transistor is associated with a sector of memory cells in each column of memory cells and having a drain, a source and a gate, the gate being coupled to a respective source select line. The sources of the source select transistors associated with each group of memory cells are connected together and to a respective source line and are electrically isolated from the sources of the source select transistors associated with other groups of memory cells. The sources of the source select transistors forms a p-n junction with the respective underlying well regions. The memory transistors in a sector of memory cells within a column are connected in series between a respective drain select transistor and a respective source select transistor. Each memory cell in the memory array is programmed and erased by tunneling of electrons between the floating gate and the channel of each memory transistor.

According to yet another embodiment of the present invention, the memory array includes memory cells arranged in rows and columns. Each column of memory cells is positioned within one of the well regions. The columns of the memory cells are divided into groups and the rows of the memory cells are divided into sectors. Each memory cell includes a memory transistor formed in the respective well region, the memory transistor including a source, a drain, and a floating gate formed over a channel of the memory transistor and a select gate coupled between a respective control line and the floating gate of the memory transistor. The memory transistors in a sector of memory cells within a column are connected in series between a first memory transistor and a last memory transistor. The drain of the first memory transistor is coupled to a respective bitline. While the sources of the last memory transistors associated with each group of memory cells are connected together and to the respective source line and are electrically isolated from the sources of the last memory transistors associated with other groups of memory cells. The sources of the last memory transistors form a p-n junction with the respective underlying well regions. Each memory cell in the memory array is programmed and erased by tunneling of electrons between the floating gate and the channel of each memory transistor.

The present invention is better understood upon consideration of the detailed description below and the accompanying drawings.

BRIEF DESCRIPTION OF THE DRAWINGS

FIGS. 6A to 6E illustrate the formation of the separated sidewall select gate structure alongside the floating gate according to one embodiment of the present invention.

FIG. 7, including FIGS. 7A to 7D, is a top view, corresponding cross-sectional views, and circuit diagram of an IGBT formed using an isolated P-well.

FIGS. 8A and 8B are a cross-sectional view and the equivalent circuit diagram of a memory cell formed using a self-aligned stacked gate memory transistor where the source of the memory transistor is merged directly with the base of a PNP IGBT.

FIGS. 9A and 9B are a cross-sectional view and the equivalent circuit diagram of a memory cell formed using a self-aligned stacked gate cell and a select transistor interposed between the base and the drain terminal of the memory cell.

DETAILED DESCRIPTION OF THE PREFERRED EMBODIMENTS

Figure 1:
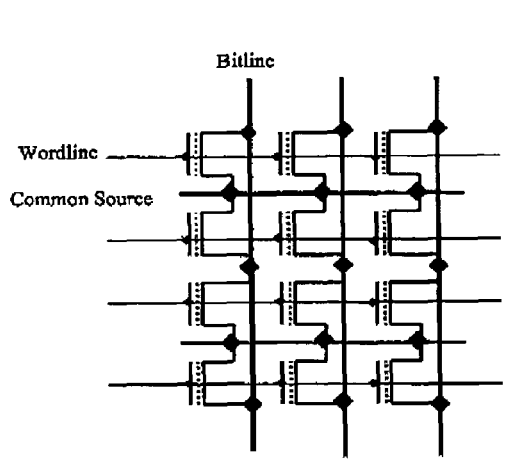
FIG. 1 is a schematic of a conventional common source non-volatile memory array.
Figure 2:
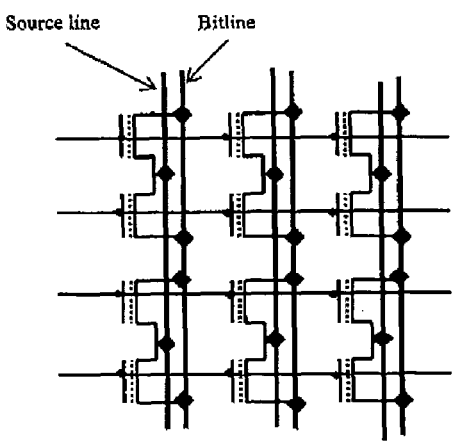
FIG. 2 illustrates another configuration of a common source non-volatile memory array where separate vertical source lines and bitlines are used.

In accordance with the principles of the present invention, a non-volatile memory array includes memory cells formed in columns of isolated well regions and connected in a common source arrangement so that Fowler-Nordheim (FN) tunneling is used for both program (write) and erase operations of the memory cells. In one embodiment, the memory array of the present invention is formed as a byte alterable EEPROM with parallel access. More specifically, writing of the EEPROM is carried out on each byte while erasing of the EEPROM is carried out selectively on each bit of memory cells. In one embodiment, the memory array of the present invention is formed using NMOS transistors in P-wells isolated by shallow trench isolation. The memory array of the present invention can be formed as a common source NOR array or a common source NAND array. In one embodiment, an insulated gate bipolar transistor (IGBT) is coupled to the memory cells to increase the cell read current of the memory array. When the memory array incorporates IGBTs on the bitlines, the cell read current becomes independent of the wordline voltages. Thus, the memory array of the present invention can be operated at lower voltages than in the case when such IGBT is not present. The use of the IGBTs in the memory array of the present invention enables formation of embedded non-volatile memories in digital integrated circuits which operate from power supply voltages as low as 1.0 Volt The non-volatile memory arrays of the present invention provide many advantages over convention non-volatile memory arrays. The non-volatile memory array of the present invention can be used to construct various types of embedded memory arrays having the following characteristics.

First, the memory arrays of the present invention can realize a full-featured (Byte Erasable) EEPROM or a Flash EEPROM (Sector Erasable) using the same or very similar memory structures. When the memory array is embedded in an integrated circuit, the memory array can be built simultaneously in the same fabrication process as the rest of the integrated circuit. Few mask additions or process modifications are required.

Second, the memory array of the present invention realizes a small memory cell size which allows the integration of relatively high density memory arrays in small silicon areas. For instance, for a 0.18 μm technology, a memory array of up to several mega-bytes can be implemented. For large array applications, the desired width of the memory cell should be close to the width of the metal lines used for the dense interconnections which is typically the fine pitch metal lines (the first and second level of metal).

Third, the memory array of the present invention realizes reduction in the power consumption during the write and erase operations of the memory array so that the required high voltages for write and erase can be generated internally from the low voltage power supply of the integrated circuit with small size charge pumps. The use of FN tunneling for both write and erase is the preferred mechanism since the amount of current necessary is in the order of nanoamps as compared to the few hundreds microamps required for memory cells which use channel hot electron (CHE) injection for programming the cells.

Fourth, the memory array of the present invention reduces the high voltage sustaining requirements typical for conventional memory device.

Fifth, the memory array of the present invention can guarantee the high endurance required for some applications. It has been proven that the highest endurance is obtained when uniform channel FN tunneling is used for both write and erase of the cells.

Sixth, the memory array of the present invention can guarantee high cell current during read and enables the use of a negative erase threshold for the memory cell to increase the cell read current. In a true single transistor memory cell such as the ETOX cell, the erase threshold has to be set positive in order to minimize the contribution to the read current from the non-selected memory cells on the same bitline. Thus, in conventional arrays, increase in cell current during read cannot be accomplished through using a negative erase threshold.

Lastly, the memory array of the present invention has the capability of storing more than one bit in the memory cell. This can be accomplished when the erase threshold of the memory cell can be set negative and high read current is realized.

Memory Cell Features

The novel memory arrays of the present invention are built using one or more of the following memory cell features. The various memory cell features will first be described and the novel memory arrays constructed therefrom will be described subsequently.

According to one feature of the present invention, a common source non-volatile memory array with FN tunneling for write and erase is built using isolated well regions for each column of memory cells. In one embodiment, the well regions are formed between trench isolation so that each well region is electrically isolated from the other by the oxide isolation. The isolated well regions enable the formation of common source memory array and the use of FN tunneling for both write and erase operations.

Figure 3:
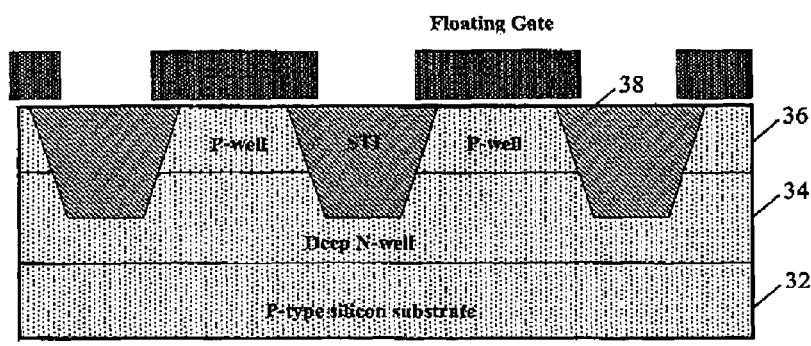
FIG. 3 is a cross-sectional view of a series of floating gates formed on isolated P-wells and illustrates the P-well structure which can be used to form the isolated P-wells in the memory arrays of the present invention

In the following description, it is assumed that the non-volatile memory array of the present invention are formed using NMOS transistors. Of course, one of ordinary skill in the art would appreciate that the memory arrays can also be formed using PMOS transistors, with the appropriate change in polarities of the diffusion types. The NMOS memory cell requires a body which can be isolated from the underlying semiconductor structure which typically includes a deep N-well formed on a P-type substrate. Thus, the NMOS memory cells are formed in P-wells (the body of the NMOS transistor) that are formed in the deep N-well. FIG. 3 is a cross-sectional view of a series of floating gates formed on isolated P-wells and illustrates the P-well structure which can be used to form the isolated P-wells in the memory arrays of the present invention.

Referring to FIG. 3, a deep N-well 34 is formed in a P-type semiconductor substrate. P-wells 36 are formed on top of deep N-well 34 and each P-well is isolated by shallow trench isolation (STI) 38. In the present illustration, P-wells 36 are formed using ion implantation simultaneously with the Deep N-well implant and using the same mask. While the energy of the Deep N-well implant (usually done with Phosphorus ions) is high enough to place the peak of the implant below the oxide isolation, the energy of the P-well implant (usually done with Boron ions) is adjusted in such a way that the P-well diffusion junction depth is shallower that the oxide isolation. The result is the formation of P-wells 36 that are self-aligned to the silicon islands bound by the oxide isolation 38 over the area of Deep N-well 34.

According to another feature of the present invention, a control/select gate for use in conjunction with a memory transistor is formed using a maskless processing step. It is generally understood that a control gate in a non-volatile memory refers to a gate for use in sensing the state of the memory transistor (on or off) while a select gate in a non-volatile memory refers to a gate used to select the memory transistor. In an EEPROM array, the control gate is typically formed as a stacked gate where the control gate is formed above the floating gate in a stack. On the other hand, the select gate or select transistor is formed apart from the floating gate, such as adjacent the floating gate, and may partially overlap the floating gate. While this nomenclature will be followed in the present description, it is instructive to note that in some embodiments of the present invention, the select transistor is formed to perform both the sensing and the selecting operations in the memory cell. Thus, the use of the term "select gate" or "select transistor" in the present description is not intended to limit the functions of the select gate or select transistor to select function only and a "select gate" or "select transistor" in the memory cell of the present invention may also provide sensing function for the memory cell. Furthermore, in the following description, the term "control/select gate" is used to refer to a gate or a transistor formed in conjunction with a memory transistor where the gate can be a control gate or a select gate or the gate can function as both a control gate and a select gate as described above.

In one embodiment, the select gate of a floating gate memory cell is formed as a polysilicon sidewall structure alongside the floating gate of the memory transistor. The use of a polysilicon sidewall structure as the select gate overcomes many of the problems of the conventional control gate/floating gate structure mentioned above. FIGS. 4A to 4E illustrate the top view of a sidewall select gate and floating gate structure and the corresponding cross-sectional views along a line A–A' and a line B–B' of the select gate/floating gate structure. The sidewall select gate structure shown in FIGS. 4A to 4E can be used in the EEPROM arrays of the present invention where FN tunneling is used for both writing and erasing of the memory cells.

Figure 4A:
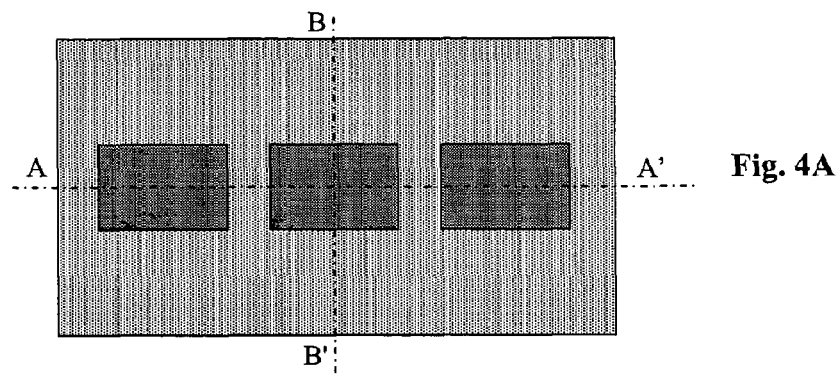
FIGS. 4A to 4E illustrate the top view of a sidewall select gate and floating gate structure and the corresponding cross-sectional views along a line A–A' and a line B–B' of the select gate/floating gate structure.
Figure 4B:
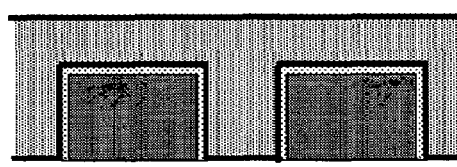
Figure 4C:
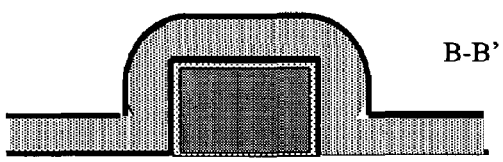

Referring to FIG. 4A, a first polysilicon layer is deposited and patterned into polysilicon islands to form the floating gates of the memory cells. Then a dielectric layer is deposited and a second polysilicon layer is deposited conformaly over the polysilicon islands. The spacing between the polysilicon islands is assumed to be less than twice the thickness of the second polysilicon layer. The dielectric layer deposited underneath the second conformal polysilicon layer also acts as an etch stop during the subsequent etching of the second polysilicon layer to form the sidewall select gates. In floating gate memory devices, the inter-poly dielectric is usually a sandwich layer made of thin layers of oxide and silicon nitride (usually called a ONO layer). FIGS. 4B and 4C illustrate the cross-sectional view of the polysilicon structure after the conformal deposition of the second polysilicon layer.

Figure 4D:
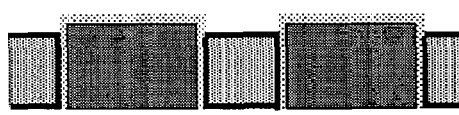
Figure 4E:
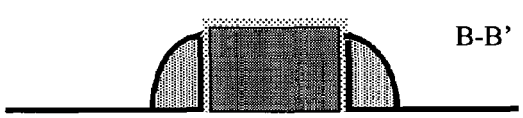

To form the sidewall select gates, an anisotropic etch of the second polysilicon layer is performed. Usually, the etch process includes some amount of overetch. Sidewall select gate structure is thus formed alongside the floating gate (the first polysilicon layer) as shown in FIGS. 4D and 4E. The amount of recess of the sidewall structures below the top of the floating gate islands depends on the amount of overetch applied.

The sidewall select gate structure described above can be formed with the two sidewall portions shorted together or the structure can be formed with the two sidewall portions separated. In the present description, the term "sidewall select gate" is used to refer to a sidewall select gate structure where the two sidewall portions are shorted together while the term "separated sidewall select gate" is used to refer to a sidewall select gate structure where the two sidewall portions are separated (i.e. electrically insulated).

Figure 5A:
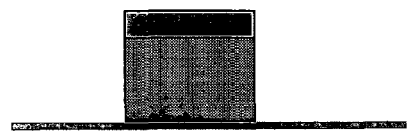
FIGS. 5A to 5D illustrate in more details the formation of the sidewall select gate structure with the two sidewall portions shorted together.
Figure 5B:
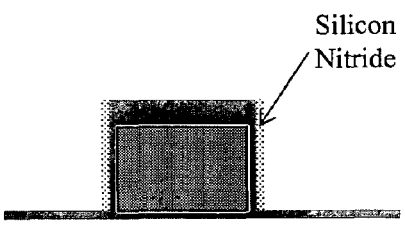
Figure 5C:
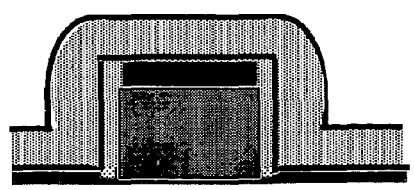
Figure 5D:
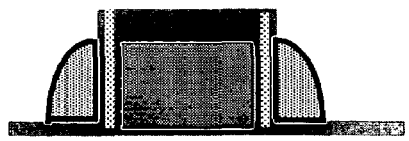

FIGS. 5A to 5D illustrate in more details the formation of the sidewall select gate structure with the two sidewall portions shorted together. FIG. 5A is a cross-sectional view of a memory cell taken along the bitline after patterning the first polysilicon layer which forms the floating gates. The dielectric over the first polysilicon layer consists of a layer of silicon dioxide formed partially by thermal oxidation of the polysilicon and by deposition. The thickness of such oxide is appropriately chosen as will be explained later. The first polysilicon layer is insulated from the silicon substrate by the tunnel oxide. After forming a thin (5–10 nm) of thermal oxide on the sidewalls of the floating gates, a layer of thin (5–10 nm) silicon nitride is deposited and anisotropically etched, leaving the thermal oxide and the nitride only on the sidewalls as shown in FIG. 5B. After an additional thermal oxidation, a layer of oxide is deposited over the structure. This completes the formation of the ONO stack on the sidewall of the floating gate. The second polysilicon layer is then deposited as shown in FIG. 5C. The oxide thickness under the select gate is thicker than the tunnel oxide and can be independently adjusted. The second polysilicon layer of is then anisotropically etched with some amount of overetch to obtain the sidewall select gate structure, as shown in FIG. 5D.

In FIG. 5D, the thickness of the second polysilicon layer removed during the overetch is assumed to be less than the thickness of the oxide deposited on top of the first polysilicon layer. Thus, the height of the sidewall polysilicon is larger than the height of the first polysilicon layer (the floating gate). This is a desirable feature for the memory cell.

The sidewall select gate structure of the present invention provides many advantages over conventional control gate/floating stacked gate structure. First, there is no need of a photoresist pattern over the second polysilicon layer to define the width of the wordlines. Second, the total height of the memory cell is reduced since the second layer of polysilicon is removed from the top of the floating gate. Third, there is no constraint on the ratio between the thickness of the first and second polysilicon layers. Fourth, the fabrication process is simplified since there is no need to create a ONO layer on top of the first polysilicon layer.

It can be shown that the absence of the second polysilicon layer on the top of the floating gate reduces the gate coupling ratio of the memory cell by less than 5% in the case of a cell drawn with 0.18 um layout rules and assuming the same height of the first polysilicon layer (0.35 um) and the same ONO equivalent thickness (15 nm).

In some applications, it is desirable for the select gate formed on the sidewalls of a floating gate to have electrically isolated sidewall portions. FIGS. 6A to 6D illustrate the formation of the separated sidewall select gate structure alongside the floating gate.

Figure 6A:
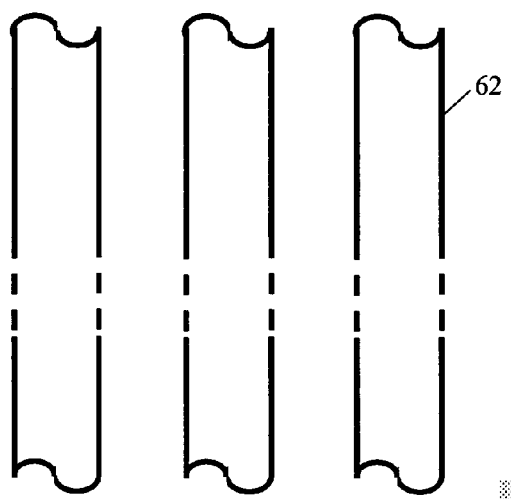
Figure 6B:
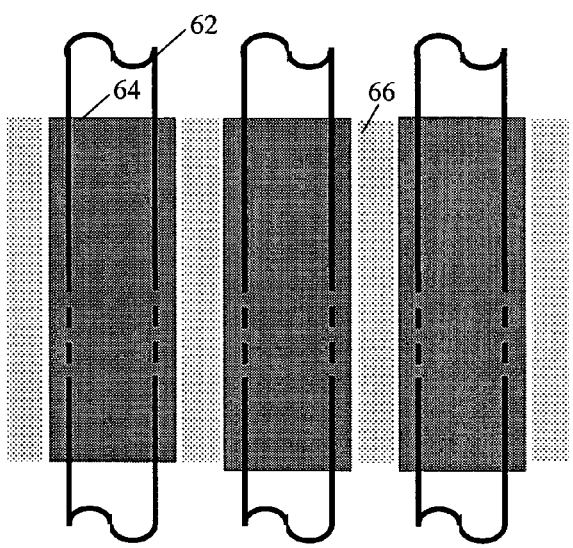

FIG. 6A is a top view of a portion of a memory array after the definition of the Shallow Trench Isolation, the self-aligned P-wells (boxes 62) and the tunnel oxidation. Next, the floating gate polysilicon is deposited and patterned as shown in FIG. 6B. After a thin thermal oxide is grown over the floating gate polysilicon, the gaps between the vertical floating gate stripes are filled with a suitable dielectric such as silicon nitride. The top surface of the polysilicon/dielectric structure is planarized using etchback or by chemical mechanical polishing (CMP).

Figure 6C:
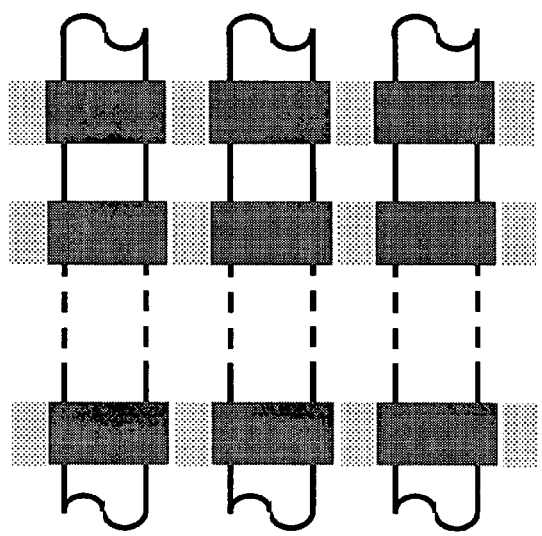
Figure 6D:
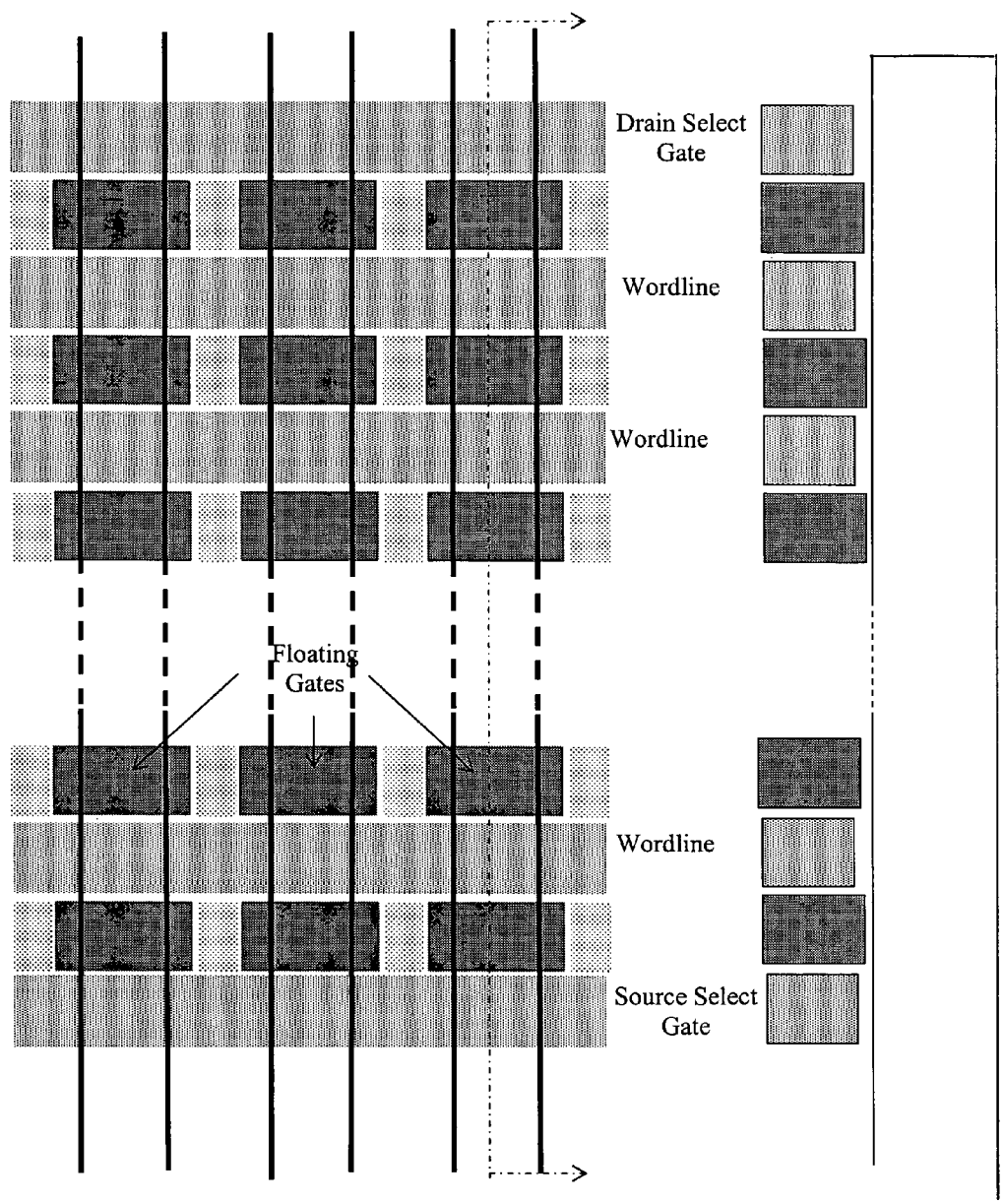

Then, using a second mask, the floating gates are separated as shown in FIG. 6C. During the etch process, the floating gate polysilicon and the silicon nitride are removed in the horizontal direction. Subsequently, the process described above for forming select gates on the sidewalls of the floating gates is employed. FIG. 6D illustrates the top view and the corresponding cross-sectional view of a portion of the memory array after the completion of the maskless definition of the select gates. As shown in FIG. 6D, the select gates are formed on the sidewalls of the floating gate and the two sidewall portions are electrically isolated from each other.

At the edge of the rows of floating gates, the select gates will wrap around and will be shorted to each other, as shown in FIG. 6E. An additional masking and etch step with a proper layout can be performed after the maskless definition of the select gates to remove the end portions.

According to another aspect of the present invention, a non-volatile memory array of the present invention incorporates an insulated gate bipolar transistor (IGBT) for increasing the memory cell read current. When a self-aligned isolated P-well is available as in all the memory arrays described here, the isolated P-well can be used as the collector of a vertical PNP bipolar transistor. When the base diffusion of the IGBT device is merged to the drain of an N-channel MOS device, a IGBT can be constructed as shown in FIG. 7. FIG. 7, including FIGS. 7A to 7D, is a top view, corresponding cross-sectional views, and circuit diagram of an IGBT formed using an isolated P-well. FIG. 7 illustrates the formation of a PNP bipolar transistor merged with an NMOS transistor. In other embodiments, the IGBT can be formed as an NPN bipolar transistor for use in conjunction with a PMOS transistor.

The inventor of the present invention discovers that an IGBT can be advantageously applied in a non-volatile memory array for increasing the cell read current. For instance, an NMOS memory transistor can be merged with the base of a PNP IGBT. The base current of the PNP bipolar transistor is supplied by the N+ source and flows through the channels controlled by the voltage applied to the select gate and coupled to the floating gate. The emitter of the IGBT is coupled to the bitline of the memory array to provide enhanced cell current during the read operation, the enhancement being equal to the current gain of the bipolar device.

Figure 10A:
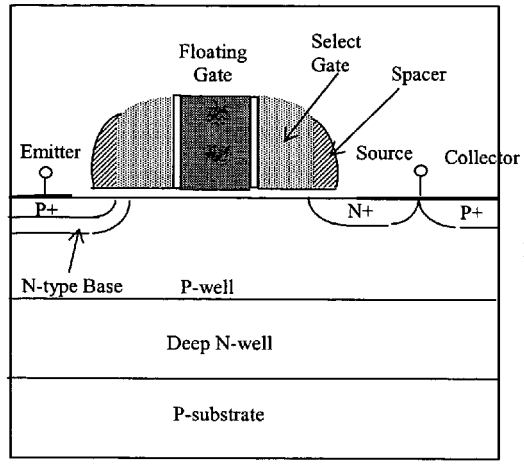
FIGS. 10A and 10B are a cross-sectional view and the equivalent circuit diagram of a memory cell formed using a separated sidewall select gate in the memory transistor.
Figure 10B:
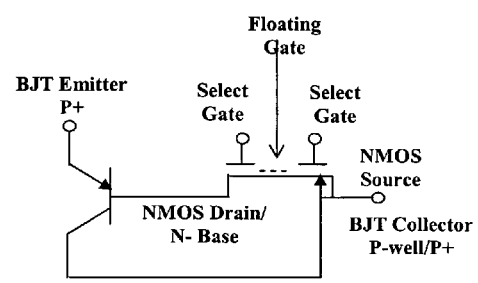

The following description illustrates three types of memory transistors being merged with the base of an IGBT in a nonvolatile memory cell. FIGS. 8A and 8B are a cross-sectional view and the equivalent circuit diagram of a memory cell formed using a self-aligned stacked gate memory transistor where the source of the memory transistor is merged directly with the base of a PNP IGBT. FIGS. 9A and 9B are a cross-sectional view and the equivalent circuit diagram of a memory cell formed using a self-aligned stacked gate cell and a select transistor interposed between the base and the drain terminal of the memory cell. In this memory cell, the additional select transistor has to be turned on to access the memory cell. Finally, FIGS. 10A and 10B are a cross-sectional view and the equivalent circuit diagram of a memory cell formed using sidewall select gates in a memory transistor, which can be shorted together or separated.

In all three cases, the source and collector junctions are grounded. When the memory cell in the "on" state, a positive bias on the emitter terminal of the IGBT will forward bias the Emitter-Base junction, causing the PNP transistor to conduct. If the memory cell is in the "off" state, there is no base current after the steady state has been reached and as a result no emitter current through the PNP transistor. When the devices shown in FIGS. 8A, 8B, 9A, 9B, 10A and 10B are used in a non-volatile memory array, the collector current of the PNP is the cell current which is sensed. Importantly, when an IGBT is used, the cell read current can be independent of the wordline voltage, enabling low voltage operation of the memory array A cell current of the order of 20 µA is already a difficult target for a conventional non-volatile memory cell which is built in advanced CMOS technologies. The current gain of a properly designed PNP transistor can easily be over 100. In the memory cell of the present invention, the MOS memory transistor has to supply only the base current, only a fraction of a micro-amps is adequate for creating a 20 µA cell current. This current amplification property is very advantageous and the use of the IGBT has little effect on the size of the memory cell as it will be described in more detail below. In addition the gate voltage of the merged MOS devices has to be raised by a very small amount (a few hundred millivolts) above the threshold voltage which is advantageous for low voltage operation.

Non-Volatile Memory Arrays

The memory cell features described above can be used to form non-volatile memory arrays having the characteristics described above and overcoming many of the shortcoming of the conventional memory arrays. The following descriptions provide explanatory embodiments of memory arrays which can be formed according to the present invention. The embodiments described herein are not intended to be limiting. One of ordinary skill in the art, upon being apprised of the present invention, would appreciate that other configuration of memory arrays can be formed using the memory cell features of the present invention.

Furthermore, the schematics of memory arrays described herein are drawn for implementing a byte selectable EEPROM with parallel access. However, one of ordinary skill in the art would appreciate that the group of bits which can be selected can be a byte, a word or any other number of bits. For simplicity, a byte is used for the group of bits for all the arrays described herein.

A non-volatile memory array of the present invention can be implemented by organizing the memory cells in a NOR fashion to form a Common Source EEPROM array or the memory cells can be organized in series to form a NAND EEPROM array. In all the memory arrays shown herein, means for suppressing the cell current of deselected memory cells which are in the "on" state are provided and the erase threshold of the memory cell can be set to be a negative voltage value.

Common Source EEPROM Array

Figure 11:
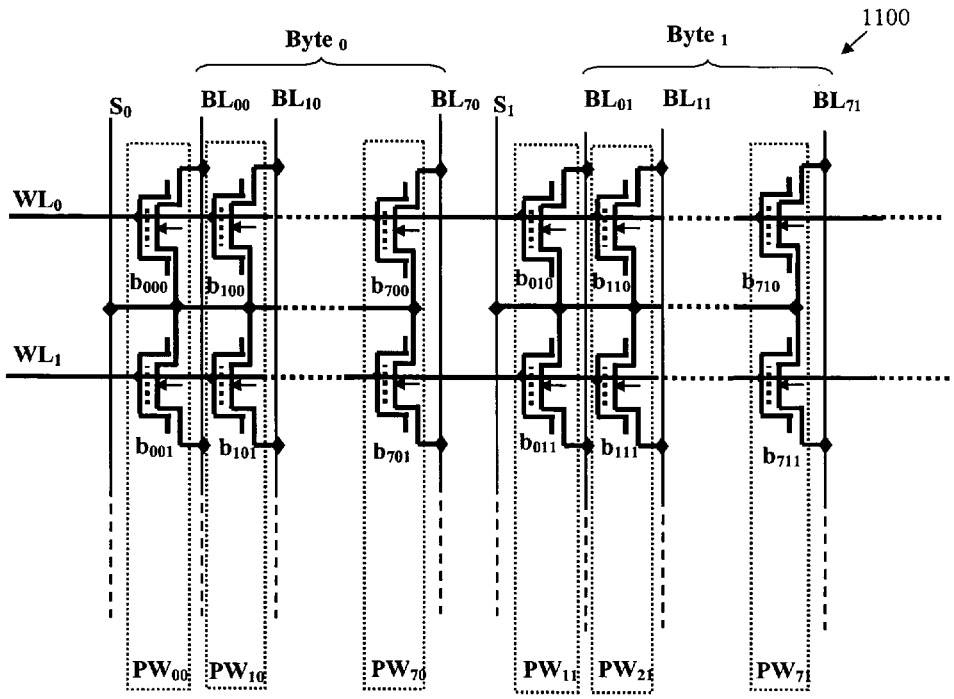
FIG. 11 is a schematic diagram of a common source memory array according to one embodiment of the present invention.

FIG. 11 is a schematic diagram of a common source memory array according to one embodiment of the present invention. Referring to FIG. 11, common source memory array 1100 is formed by organizing the memory cells in a NOR fashion and the memory array is therefore sometimes referred to as a "NOR array." Memory array 1100 includes isolated P-wells $PW_{00}$, $PW_{10}$ ... $PW_{70}$, $PW_{11}$ to $PW_{71}$ and so on. In one embodiment, the P-wells are formed using the process described above and are isolated from each other by using shallow trench isolation. The P-wells are formed along the vertical direction of the array and each P-well houses a column of memory cells. The electrical connection to each P-well can be made at the top and/or bottom of the memory array.

In memory array 1100, each column of memory cells is built in an isolated P-well contained in a Deep N-well which is common to the entire array. In the present embodiment, each memory cell includes a memory transistor and a select transistor. In the present embodiment, the memory transistor and the select transistor are formed using the maskless formation of sidewall select gate structure described above. Thus, the select transistor is a sidewall select gate. The select gates in each row of memory cells are connected together to a respective Wordline (WL) signal. In other embodiments, the memory transistor can be formed using a stacked gate cell with a control gate formed on top of the floating ate. In yet another embodiment, the select transistor can be formed as a separated sidewall select gate. The wordline thus forms two gates, shorted together, which isolate the memory transistor (whose gate is the floating gate) from the bitline and from the source line.

The columns of memory cells in array 1100 are divided into bytes. The sources of the memory transistors in a byte are all connected together and to a source line. A source line ($S_0$, $S_1$ and so on) is provided for each byte of memory cells. As thus configured, the memory cells in each byte have a common source and thus the array is referred to as a common source EEPROM array. In the present description, the digits used for identifying the memory cells are the bit number in the byte (0–7) followed by the byte number and the number of the wordline. Thus, BL01 is a bit line for bit 0 of byte 1 of the memory array and bit 000 is the memory cell coupled to BL01 under wordline 0.

In memory array 1100, each group of eight columns of bits shares a common source. Thus, the memory cells of each byte share a common source which is also used by the mirror byte (the mirror byte being the adjacent memory cells in a row above or below the current byte). As described above, the common source is connected to a vertical source metal line ($S_0$, $S_1$, and so on) which is common for the bits of the byte and whose function is to select the byte. This method for selecting a byte is very area efficient, when compared to conventional methods where selection is done by separating the wells or by segmenting the wordline. Furthermore, memory array 1100 of the present invention uses a source line for each byte of memory cells and does not require a source line for each bit of memory cells. In this manner, the size of the memory cell can be reduced as only one metal line (the bitline) runs vertically over each memory cell.

Memory array 1100 is programmed (written) non-selectively and erased selectively. That is, all the bits in a selected byte is written at once but each bit is erased individually. In fact, the non-selective write/selective erase feature of memory array 1100 is common to all the novel memory arrays of the present invention. The "byte writable" and not "byte erasable" nature of the memory array of the present invention is different from majority of the conventional memory arrays. However, this difference is immaterial when dealing with digital circuits because programming and erasing the memory array of the present invention merely requires reversal of the programming conditions.

Since the write operations of non-volatile memory cells by using FN tunneling require very high voltages of the order of 20 volts, it is customary to use positive and negative biases whose absolute value can now be reduced to less than 10 volts. This makes the process necessary for building these high voltage devices simpler. In the following description it is assumed that these bipolar voltages are available. Writing conditions for memory array 1100 are shown in Table 1 below. The bias voltage are typical for embedded memories built using as a baseline 0.18 μm CMOS logic process. The voltages at the terminals of the select transistors are referred to the body of the device.

Writing of the memory transistor of the selected byte (chosen as the byte with bits b000 to b700 in Table 1 below) is due to tunneling of electrons from the inverted channels to the floating gate. The bitlines and sources of the non-selected bytes are set to a convenient inhibit voltage (2V) and tunneling is prevented in the memory transistors under the selected wordline (Vg=6V) and under the non selected wordlines (Vg=−6). For the memory transistors attached to the selected bitlines under the non selected wordline the gate bias (4V) is well below the value required for tunneling. The separate source connections for each byte of memory cells prevent leakage between selected and non selected bitlines. Note also that there is no reverse bias on any source or drain junction, which is a very desirable property. A reverse bias is only present between the Deep N-well and the body of all the selected bytes (10V).

Table 1 shows the write conditions and state of the memory transistors in memory array 1100. In Table 1 below, PW stands for P-well, S stands for source, WL stands for wordline, BL stands for bitline and DNW stands for deep N-well. In Table 1 and in all other tables following, the voltage value is in the unit of volts.

TABLE 1

| Terminal | PW | S | WL | BL | WL | PW | S | BL | DNW |
|---|---|---|---|---|---|---|---|---|---|
| Suffix | 0~7, 0 | 0 | 0 | 0~7, 0 | 1 | 0~7, 1 | 1 | 0~7, 1 | |
| Write Byte$_{00}$ | −8 | −8 | 8 | −8 | −4 | 2 | 2 | 2 | 2 |
| Select Transistor | | $b_{0-700}$ | | $b_{0-710}$ | | $b_{0-701}$ | | $b_{0-711}$ | |
| Channel State | | Inv | | Inv | | Inv | | Off | |
| Final Vt | | Hi | | Unch | | Unch | | Unch | |
| Vg | | 16 | | 6 | | 4 | | −6 | |
| Vd | | 0 | | 0 | | 0 | | 0 | |
| Vs | | 0 | | 0 | | 0 | | 0 | |

As described above the erase operation of memory array 1100 is a bit-selective operation. The bias conditions are shown in Table 2 below for the case that bit b000 is erased. Erasing of the selected memory transistors is due to FN tunneling of electrons from the floating gate to the accumulated P-well. The full Vpp is present only in the selected bit and the channel region is accumulated. The channel regions of the other bits of the same byte and of the other bytes under the selected wordline are also in accumulation but the voltage between the gate and the body is not high enough for tunneling.

Note that for the erase operation, a small reverse bias of 4V is present between the common source of the byte containing the selected bit and the bodies of the nonselected bits. For all the other transistors there is no reverse bias across the source and drain junctions. A reverse bias of no more than 4V is present between the Deep N-well and the P-wells.

Table 2 shows the erase conditions and state of the memory transistors for memory array 1100.

Figure 12:
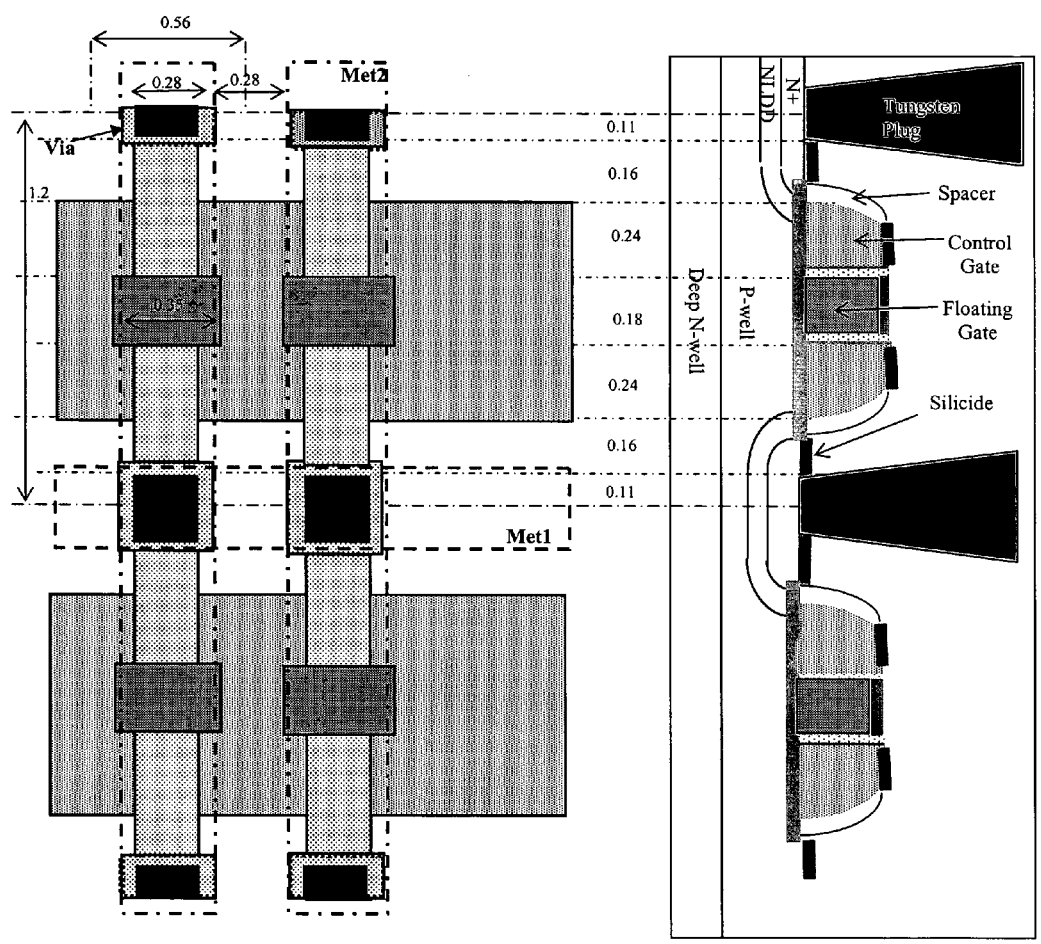
FIG. 12 illustrates a layout and a corresponding cross-sectional view of a common source EEPROM array according to one embodiment of the present invention.

FIG. 12 illustrates a layout schematic and a corresponding cross-sectional view of a common source EEPROM array according to one embodiment of the present invention. The dimensions shown in FIG. 12 are typical for a 0.18 μm technology. In this embodiment, the memory cell area is 0.67 μm$^2$. The gate coupling ratio of the cell with the layout shown in FIG. 12 and assuming a tunnel oxide thickness of 9.5 nm and an equivalent ONO thickness of 15 nm is 85%. This value is much higher that the values reported for stacked gate cells built in the same technology node which is typically 60%. High gate coupling ratio is advantageous for reducing the values of the write/erase voltages. The coupling ratios are calculated using a simple parallel plate model for the capacitors without taking into account depletion capacitances in the silicon or polysilicon and neglecting fringing effects. The absence of the second polysilicon on top of the floating gate has a very minor effect on the coupling ratio.

TABLE 2

| Terminal | S | PW | WL | WL | BL | PW | BL | $S_2$ | PW | BL | DNW |
|---|---|---|---|---|---|---|---|---|---|---|---|
| Suffix | 0 | 00 | 0 | 1 | 00 | 1–7, 0 | 1–7, 0 | 2 | 1–7, 1 | 0–7, 1 | |
| Erase Bit $b_{000}$ | 7 | 7 | −7 | 3 | 7 | 3 | 3 | 3 | 3 | 3 | 7 |
| Select Transistors | $b_{000}$ | | $b_{1–700}$ | $b_{0–710}$ | | $b_{001}$ | $b_{1–701}$ | | $b_{0–711}$ | | |
| Channel State | Accum. | | Accum. | Accum. | | Accum. | Depleted | | Depleted | | |
| Final Vt | Lo | | Unch | Unch | | Unch | Unch | | Unch | | |
| Vg | | −14 | −10 | −10 | | −4 | 0 | | 0 | | |
| Vd | | 0 | 0 | 0 | | 0 | 0 | | 0 | | |
| Vs | | 0 | 4 | 0 | | 0 | 0 | | 0 | | |

Memory array 110 can be read by using the conditions shown in Table 3. During read, the P-wells and the common Deep N-well are grounded, Vread (of the order of 1 V) is applied to the selected bitline and Vdd (ranging from 1.8 to 3.3 V depending on the technology) to the selected wordline. All the sources are grounded and the non-selected bitlines are left floating. The select transistors of the non-selected rows are turned off by grounding the wordlines. The contribution to the current of the selected bitline from the transistors sharing the same bitline but on different rows is zero since their select transistors are off. Therefore, in memory array 1100, the erase thresholds can be set to be negative.

Table 3 shows the read conditions and state of the memory transistors for memory array 1100.

NAND EEPROM Array

According to another aspect of the present invention, an EEPROM array can be built by connecting a string of memory cells in series to form a NAND memory array. One advantage of using memory cells connected in series is that there is no metal to diffusion contact in the memory cell and as a result the memory cell size is much smaller than for a memory cell in a NOR array. NAND memory arrays are usually used with serial access and the entire array or sectors of the array are erased simultaneously.

The NAND memory array described herein is implemented as a byte alterable array with parallel access. Any group (a byte, a word or other number) of bits in a row can be written simultaneously and individually erased, and the

TABLE 3

Figure 13:
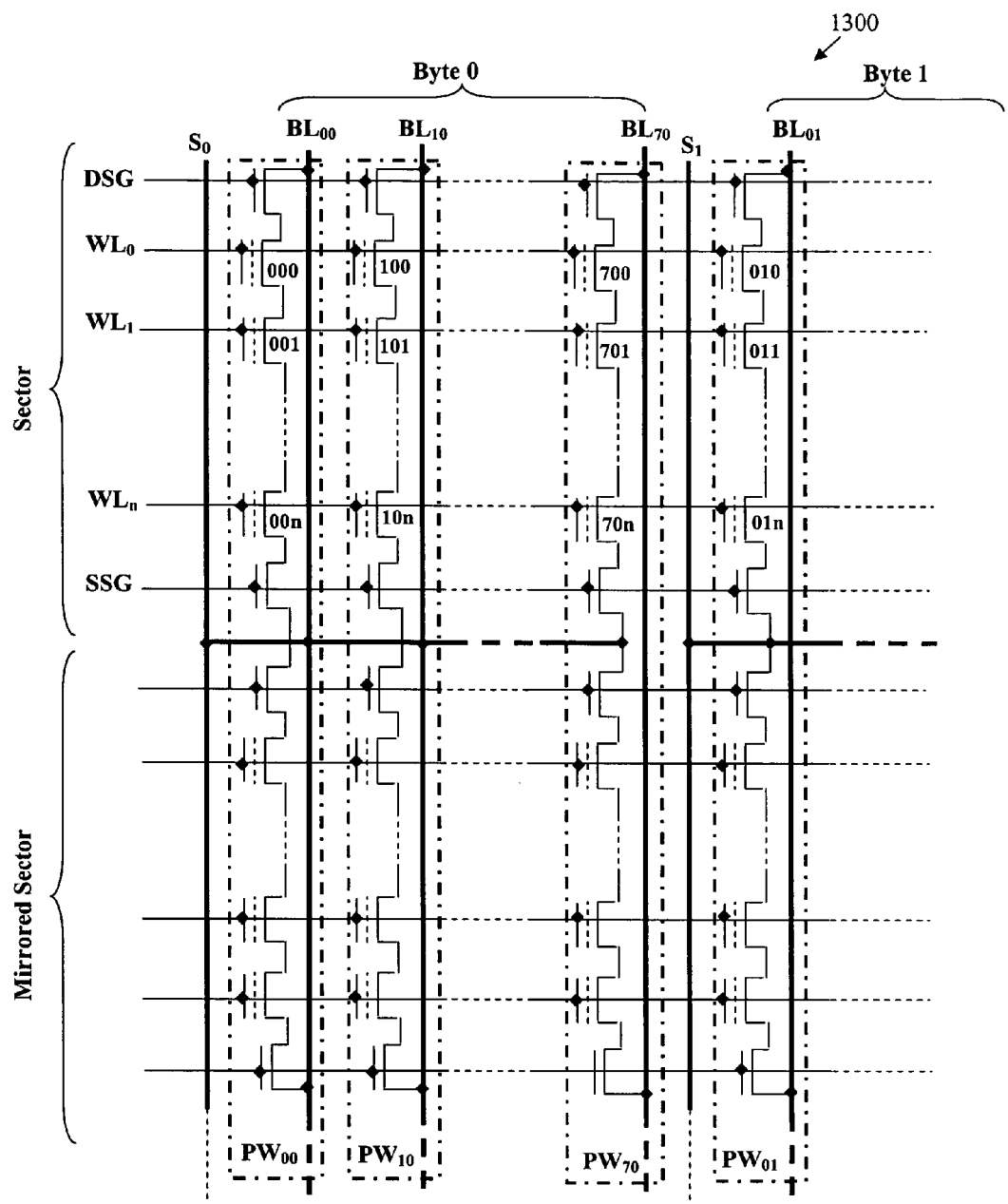
FIG. 13 is a schematic diagram of a NAND memory array according to one embodiment of the present invention.

| Terminal | S | PW | WL | WL | BL | PW | BL | S | PW | BL | DNW |
|---|---|---|---|---|---|---|---|---|---|---|---|
| Suffix | 0 | 00 | 0 | 1 | 00 | 1–7, 0 | 1–7, 0 | 1 | 0–7, 1 | 0–7, 1 | |
| Read Bit $b_{000}$ | 0 | 0 | Vdd | 0 | Vr | 0 | Float | 0 | 0 | Float | 0 |
| Select Transistors | $b_{000}$ | | $b_{1–700}$ | $b_{0–701}$ | | $b_{010}$ | $b_{1–701}$ | | $b_{0–711}$ | | |
| Channel State | on | | on | off | | off | off | | off | | |
| Vg | | Vdd | Vdd | Vdd | | 0 | 0 | | 0 | | |
| Vd | | Vr | ~Vt | ~Vt | | Vr | 0 | | 0 | | |
| Vs | | 0 | 0 | 0 | | 0 | 0 | | 0 | | | bits can be read in parallel. In the present description, memory arrays having memory cells are connected in series are referred to as NAND memory arrays. FIG. 13 is a schematic diagram of a NAND memory array according to one embodiment of the present invention.

Referring to FIG. 13, a memory array 1300 includes memory cells where columns of memory cells are formed in isolated P-wells. The isolated P-wells are formed in the deep N-well which is common to the entire array. In the present embodiment, the memory cell used is of the self-aligned stacked gate type where a control gate is formed above the floating gate.

In memory array 1300, the rows of memory cells are divided into sectors and within each sector, the memory cells are connected in series. In each sector, a Drain Select transistor (DSG) and a Source Select transistor (SSG) are provided to select the memory cells in the sector. Thus, a sector of memory cells includes the Drain Select transistor, the Source Select transistor and all the memory cells in between. Memory array 1300 is constructed by mirroring a sector along a horizontal source line and then repeating the combined sectors vertically. The sources of the source select transistors in each byte of memory cells are connected together and to a respective source line.

Although physically memory array 1300 resembles a conventional NAND array with (n+1) self-aligned stacked gate memory cells connected in series, NAND memory array 1300 of the present invention differs from the conventional NAND array in several respects. First, in NAND array 1300, all the memory cells in a column are built into a self-aligned isolated P-well. Second, the bits of a byte are built on a row and have a common wordline. Third, the common source is limited to a byte and is connected to a vertical source metal line ($S_0$, $S_1$, and so on). With this arrangement, it is possible to write a byte, selected by the bitlines and the source line, to erase a single bit of the byte and to read the bits of a byte in parallel.

Figure 14:
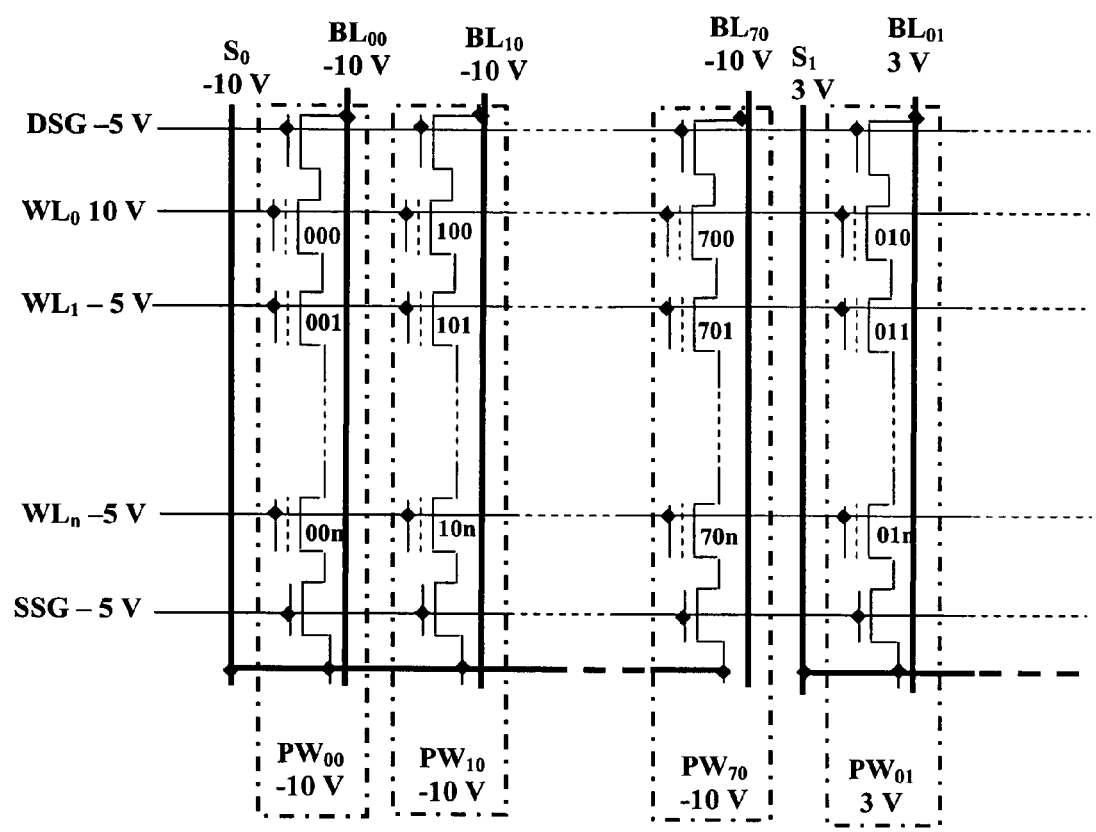
FIG. 14 shows the write conditions of the memory array of FIG. 13 where a byte of the memory cells is written at a time.

FIG. 14 shows the write conditions of memory array 1300 where a byte of the memory cells is written at a time. For simplicity, only one sector is shown and it is assumed that bipolar voltages are available. The voltage values shown in FIG. 14 are only exemplary and actual voltage values may vary depending on the gate coupling ratio of the memory cell and the thickness of the tunnel oxide. Under the bias conditions shown in FIG. 13, all the bits of byte 0 under the wordline 0 ($WL_0$) are written by FN tunneling of electrons from the inverted channels of the selected bits to the floating gate. It can be easily seen that the voltage across the tunnel oxide for all the other bits is not enough for tunneling. In the write operation of NAND array 1300, there is no reverse bias on any source or drain junction. A reverse bias is only present between the Deep N-well and the body of all the selected bytes (13 V).

Figure 15:
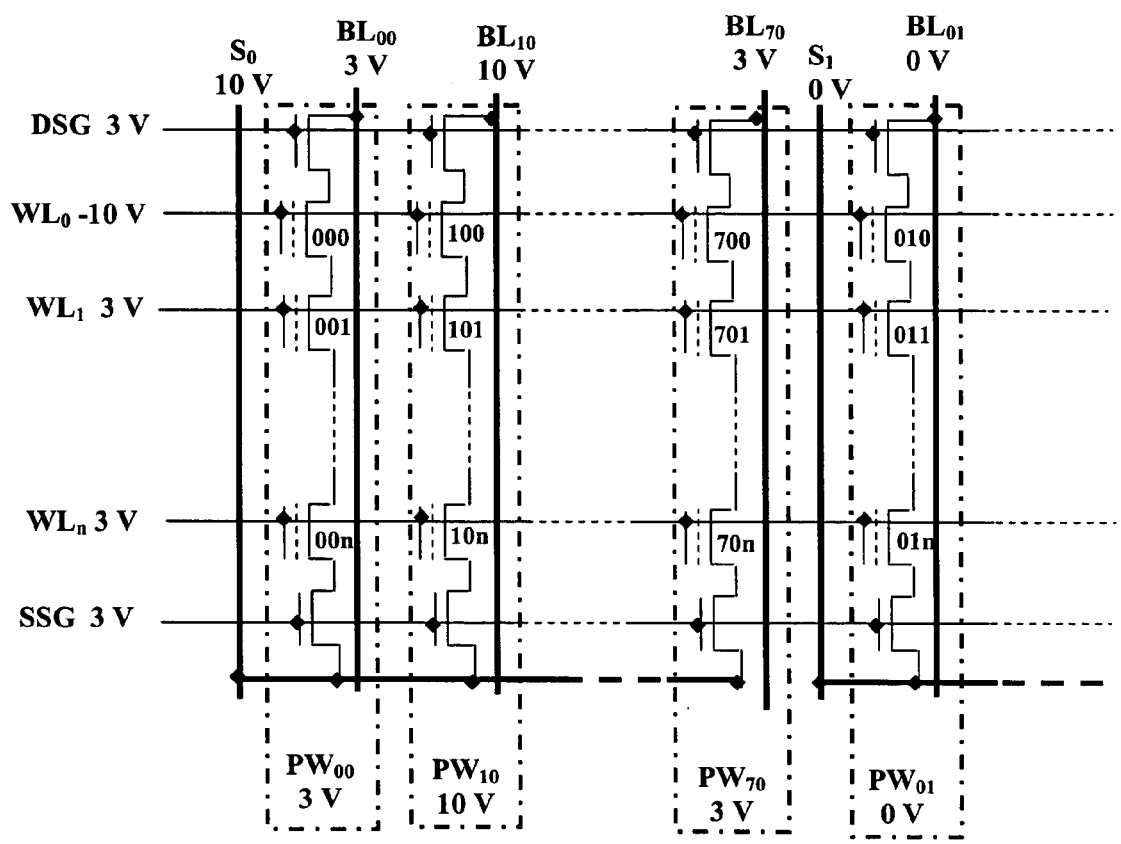
FIG. 15 shows the erase conditions of the memory array of FIG. 13.

FIG. 15 shows the erase conditions of memory array 1300. The erase operation is selective. In FIG. 15, bit 100 is the selected bit to be erased. The voltage values shown in FIG. 15 are only exemplary and actual voltage values may vary depending on the gate coupling ratio of the memory cell and the thickness of the tunnel oxide. Erasing of the selected memory transistors is due to FN tunneling of electrons from the floating gate to the accumulated P-well. The full erase voltage is present only in the selected bit and the channel region is accumulated. The channel regions of the other bits are either in accumulation or depletion and the voltage between the gate and the body is not high enough for tunneling. In the erase operation of NAND array 1300, a small reverse bias of 7V is present between the common source of the byte containing the selected bit and the bodies of the non-selected bits. For all the other transistors, there is no reverse bias across the source and drain junctions. A reverse bias of no more than 7V is present between the Deep N-well and the P-wells.

Figure 16:
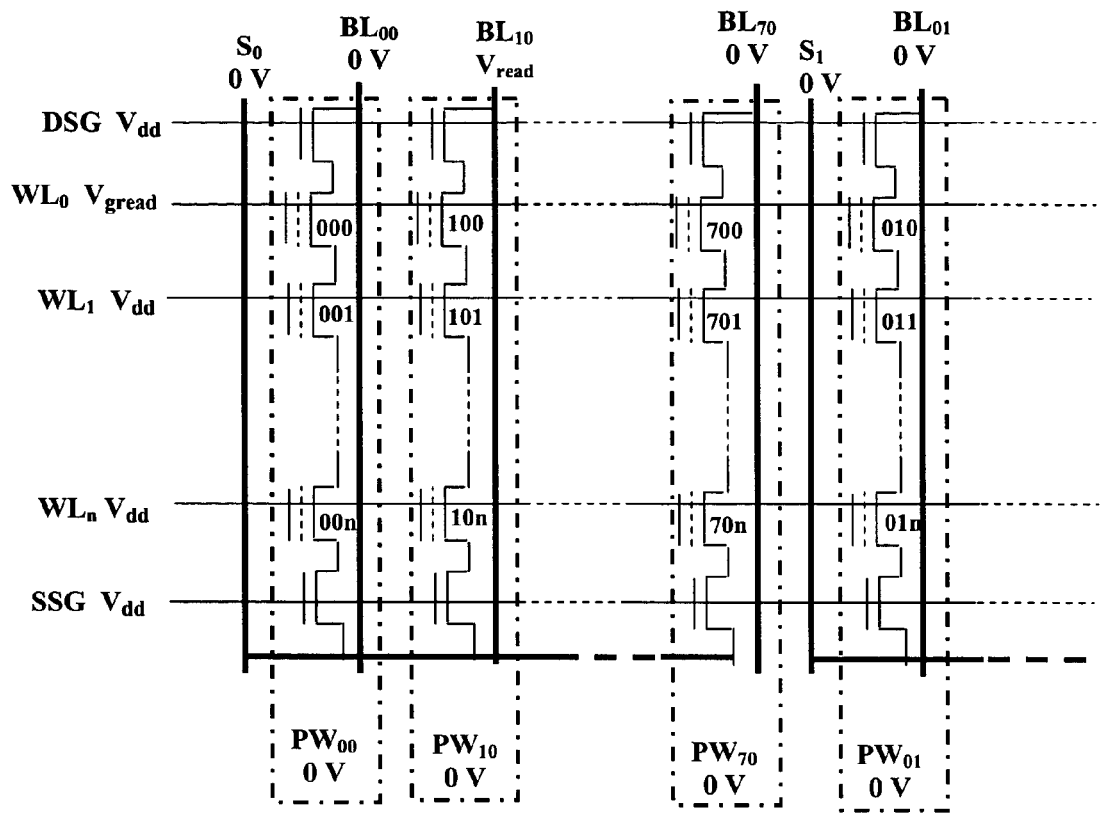
FIG. 16 shows the read conditions of the memory array of FIG. 13.

FIG. 16 shows the read conditions of memory array 1300. In the present illustration, it is assumed that bit 100 is read. During the read operation, the drain and source select transistors are turned on and the voltage applied to the non-selected wordline is such that the voltage coupled to the floating gates is higher that the written threshold $V_{tfgw}$ of the cells by a margin. This requirement puts an upper limit to $V_{tfgw}$. The voltage on the selected wordline $V_{gread}$ has to be such that the voltage coupled to the floating gate (k* Vgread where k is the gate coupling ratio) when the cell is "on" is above the erased threshold of the cell and below the written threshold.

Figure 17:
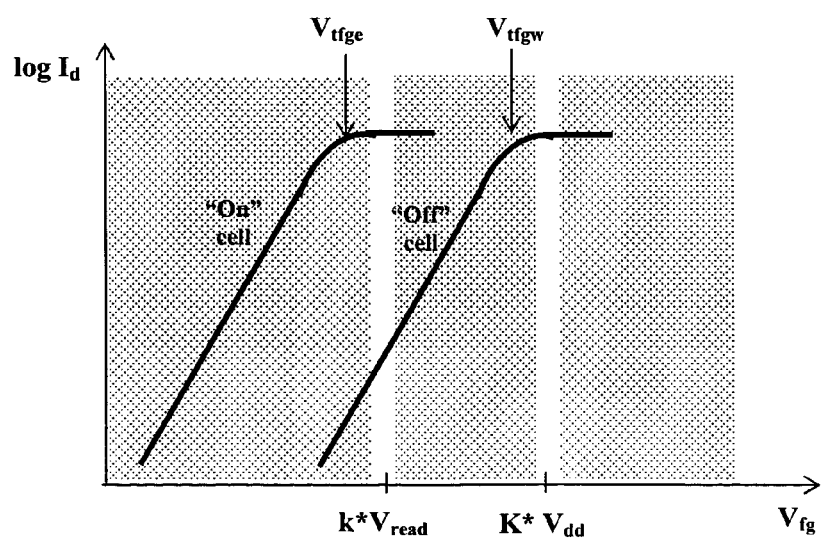
FIG. 17 is a graph illustrating the $I_d$ VS. $V_{fg}$ curves of the memory transistors in the on state and in the off state.

The constraints on Vdd and Vread can be understood by observing the graph in FIG. 17 where the $I_d$ vs. $V_{fg}$ curves of the memory transistors in the on state and in the off state are plotted. Notice that the erase threshold can be of any value below $k*V_{gread}$ and can be negative.

NAND Memory Array with IGBT's

Figure 18:
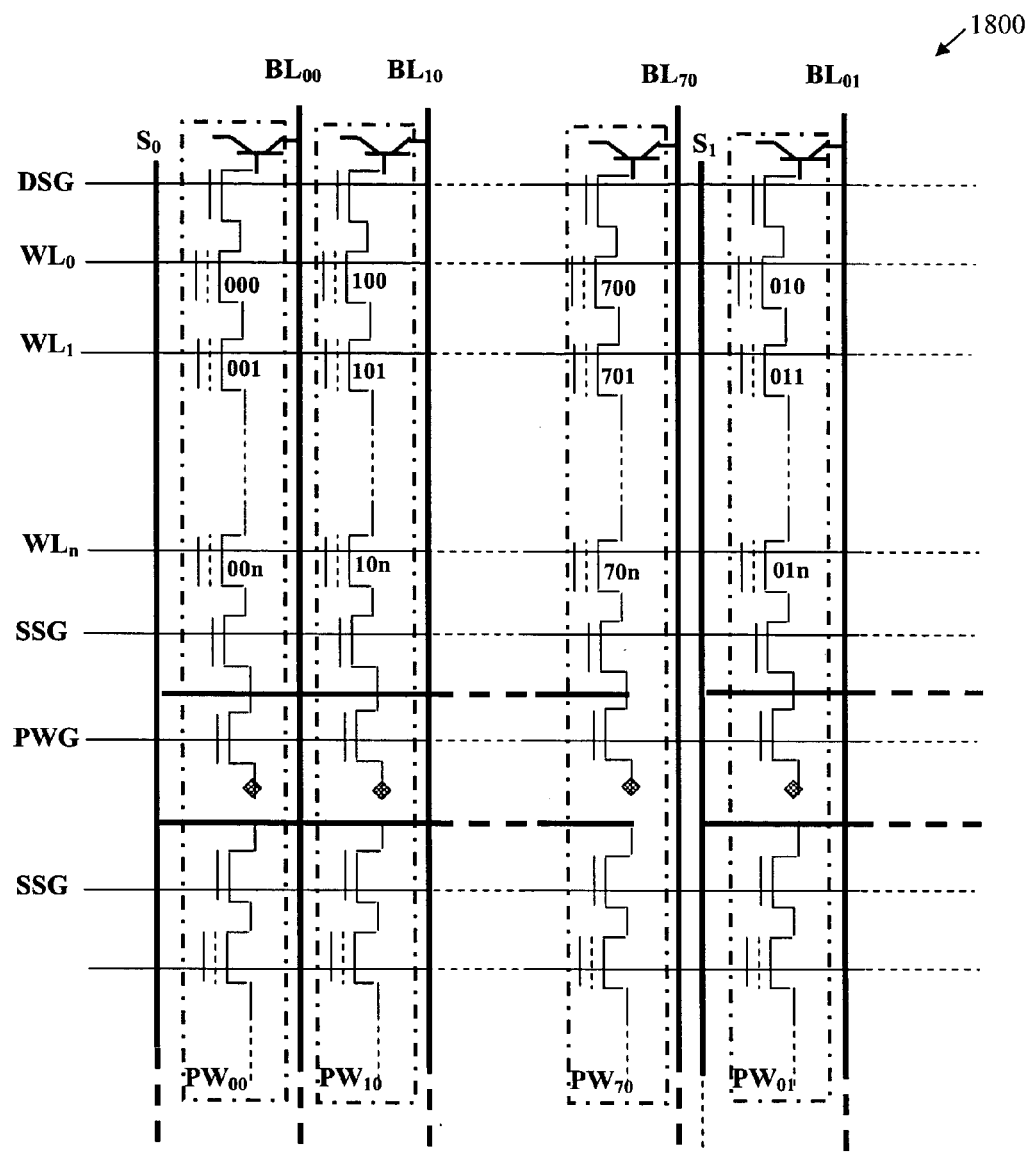
FIG. 18 is a schematic diagram of a NAND memory array incorporating IGBT's for increasing the cell read current according to one embodiment of the present invention.
Figure 19:
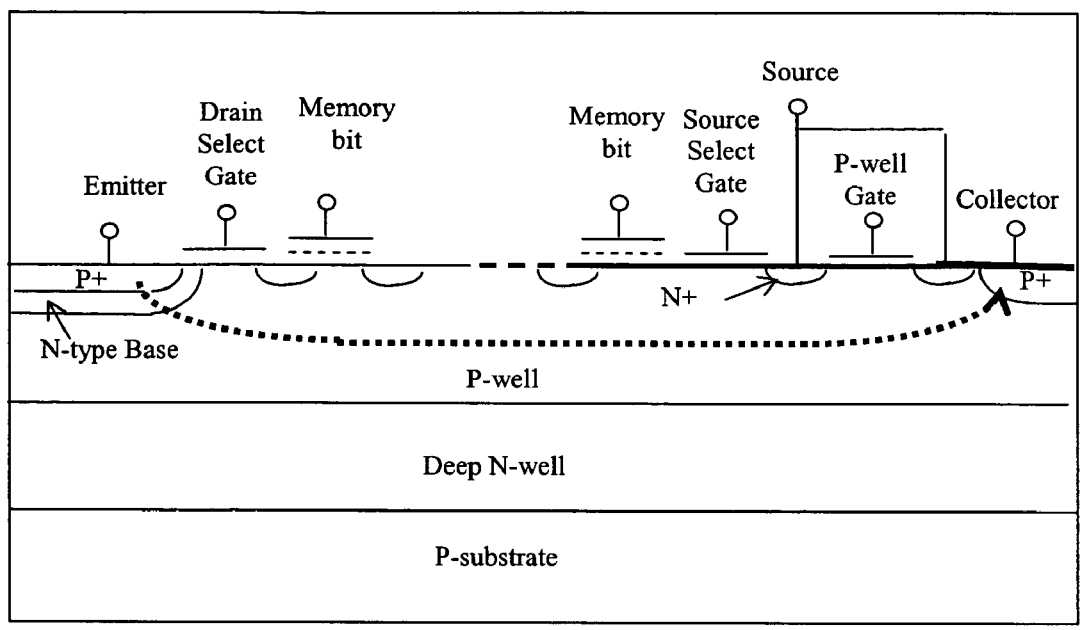
FIG. 19 is a cross-sectional view of a sector of memory cells illustrating the coupling of the IBGT to the sector of serially connected memory cells.

FIG. 18 is a schematic diagram of a NAND memory array incorporating IGBT's for increasing the cell read current according to one embodiment of the present invention. Referring to FIG. 18, NAND memory array 1800 is constructed in the same manner as NAND memory array 1300 of FIG. 13 with two additions. First, the bitline of each column of memory cells in a sector is connected to an IGBT. That is, the IGBT is interposed between the bitline and the Drain Select transistor (DSG) of each sector of memory cells. FIG. 19 is a cross-sectional view of a sector of memory cells illustrating the coupling of the IBGT to the sector of serially connected memory cells. Second, the source lines at the bottom of each sector of memory transistors can be connected with a PWG transistor to all the individual P-wells with a butted contact shorting the source of the PWG transistor to the underlying P-well.

The advantage of adding the IGBT and coupling the IGBT to the bit line is increased cell read current. The motivation for adding the PWG transistors for shorting the sources to the individual wells is due to the fact that during the erase operation, the source of the selected byte has a reverse bias towards the non-selected P-wells of the selected byte. During this operation, the shorting PWG device must be open. During the read operation, the collector current of the PNP (approximately equal to the cell current) flows to the ohmic contact of the P-well. This current creates a voltage drop across the P-well diffusion which tends to forward bias the Source N+/P-well junction. This may trigger the turn-on of the vertical parasitic NPN (N+ Source/P-well/Deep N-well) and this is not desirable. An effective way to reduce this forward bias is to place the P+ ohmic connection as close as possible to the N+ Emitter. The addition of the shorting PWG device is an effective way to minimize the problem during the read operation The conditions for write and erase in memory array 1800 are the same as for the NAND array 1300 in FIG. 13. This is because during the write and erase operations there are no bias across the Emitter-Base junction of all the bipolar PNP transistors. The bias on the gate of the shorting transistors (PWG transistors) is −5V during write (the PWG transistors are on), 3V during erase (the PWG transistors are off) and vdd during read (the PWG transistors are on).

The bitline voltage during read is around 0.9 V. During read, care must be taken to minimize the collector current of the parasitic NPN transistor as described above. This requirement puts a limit on the maximum Collector (cell) current and on the forward bias which can be applied on the Emitter-Base junction (Vread).

NAND Memory Array with Select Transistors

In FIGS. 13 and 18, the NAND memory arrays are formed using self-aligned stacked gate cell and the gate coupling ratio is limited to about 0.6, unless the size of the cell is increased. However, as described above, when sidewall select gate structures are used, the gate coupling ratio can be made much higher as the coupling capacitors are formed on the sidewalls of the floating gate. A high gate coupling ratio translates into lower high voltage requirements which are a desirable property for embedded nonvolatile memory arrays. Thus, in accordance with another aspect of the present invention, a NAND memory array is provided whereby the memory cell includes select transistors that are formed as sidewall select gates adjacent the floating gate.

Figure 20:
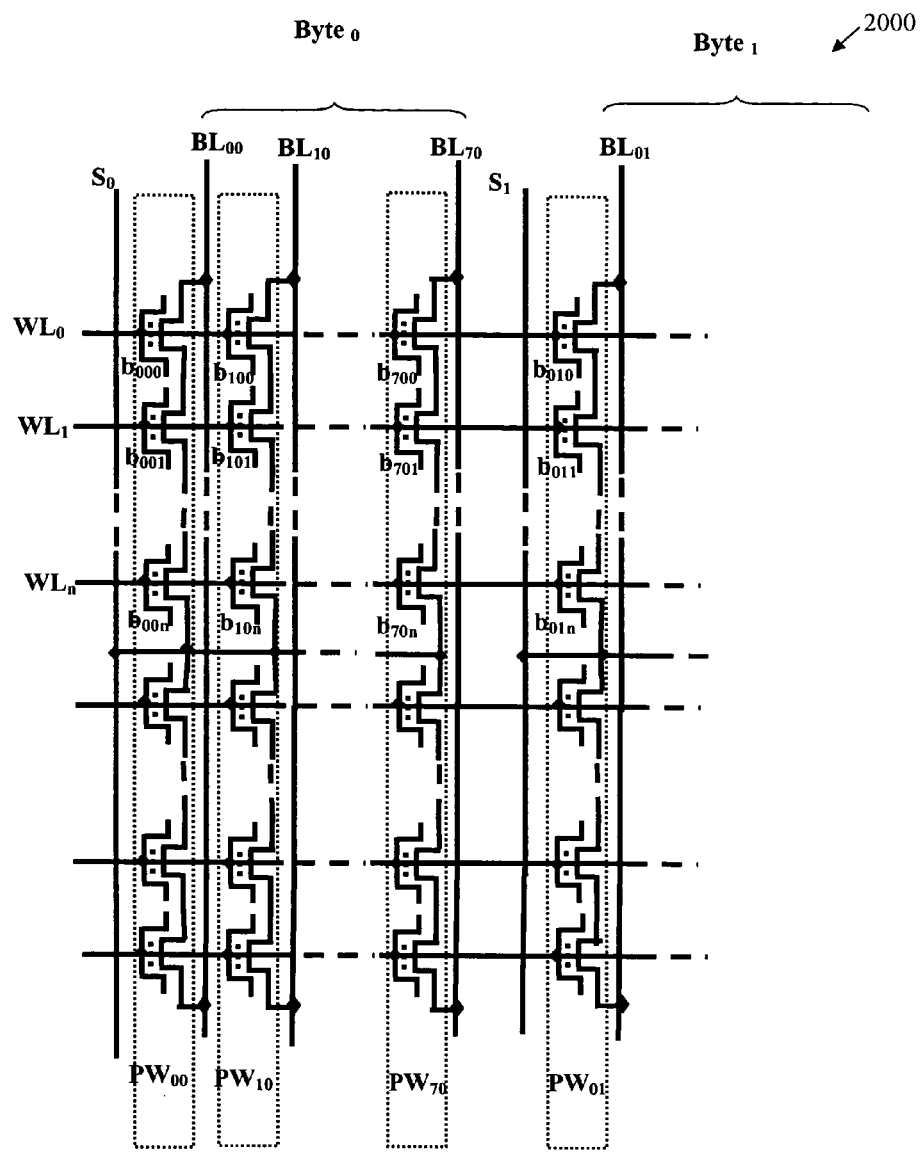
FIG. 20 is a schematic diagram of a memory array where each memory cell includes a sidewall select transistor according to one embodiment of the present invention.

FIG. 20 is a schematic diagram of a memory array 2000 where each memory cell includes a sidewall select transistor according to one embodiment of the present invention. In the present embodiment, the two sidewall portions of the select transistor are shorted together. When the select transistor is provided, each sector of memory cells includes n number of memory transistors connected in series between the bitline and the common source line. No drain select transistor or source select transistor is needed because each memory cell has a select transistor.

Figure 21:
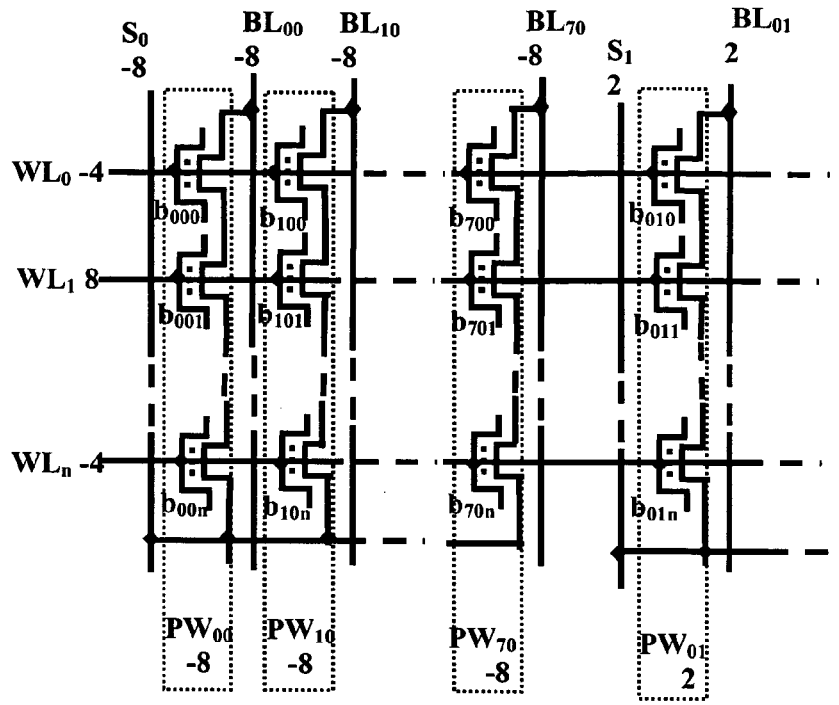
FIG. 21 shows the write conditions of the memory array of FIG. 20.
Figure 22:
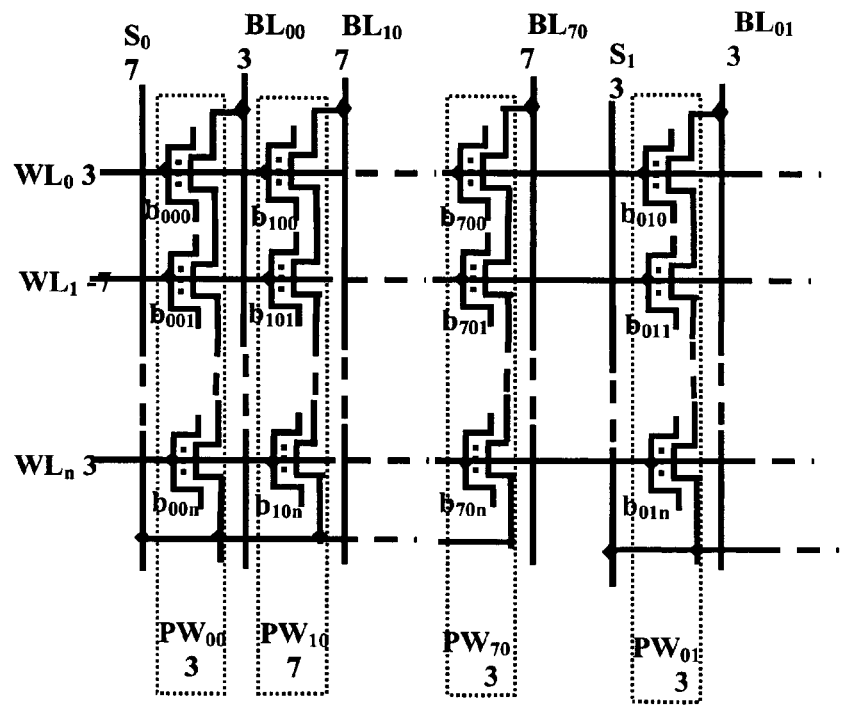
FIG. 22 shows the erase conditions of the memory array of FIG. 20.

FIG. 21 shows the write conditions of memory array 2000. In this configuration, lower programming voltages can be used because of larger gate coupling ratio. FIG. 22 shows the erase conditions of memory array 2000. The voltage values shown in FIGS. 21 and 22 are exemplary only. Reading operation of memory array 2000 can be carried out using the same bias condition as for memory array 1300 of FIG. 13.

NAND Memory Array with Select Transistors and IGBTs

Figure 23:
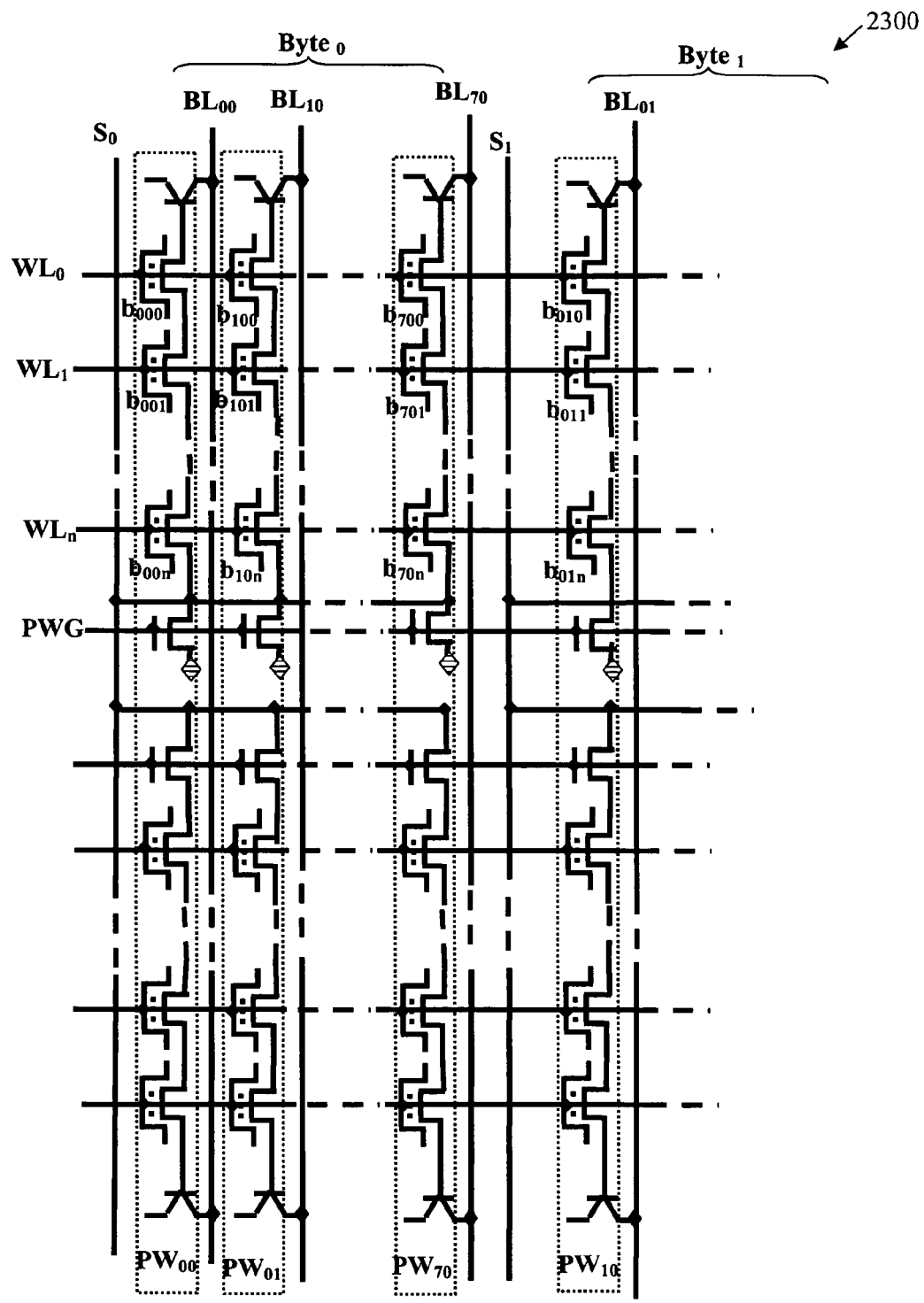
FIG. 23 is a schematic diagram of a NAND memory array incorporating IGBTs according to one embodiment of the present invention.

According to another aspect of the present invention, NAND memory array 2000 can be modified by adding IGBTs between the first memory cell in a sector and the respective bitline for the purpose of increasing the cell read current. FIG. 23 is a schematic diagram of a NAND memory array incorporating IGBTs according to one embodiment of the present invention. Memory array 2300 is constructed in the same manner as memory array 2000 of FIG. 20 but includes PNP bipolar transistors interposed between the first memory cell in a sector and the respective bitline.

NAND Memory Array with Separate Select Transistors

Figure 24:
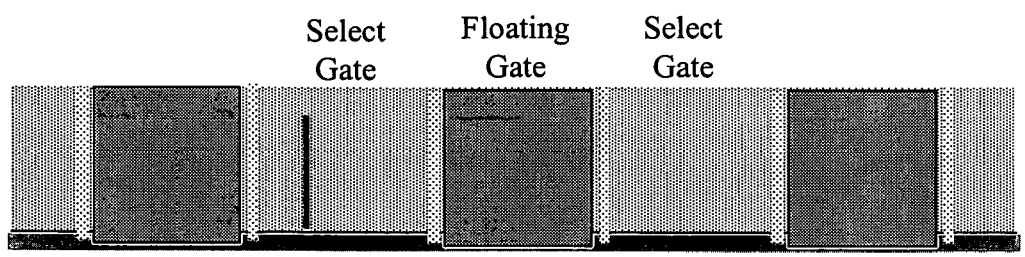
FIG. 24 illustrates a cross-sectional view of a series of memory cells with separated sidewall select gates.
Figure 25:
FIG. 25 illustrate the schematic symbol of a memory cell for identifying a separated sidewall select gate.

In NAND memory array 2000 of FIG. 20, the sidewall select gates of the memory cells are shorted together and it is necessary to use a space between the select gates of neighboring cells, making the memory cell bigger. According to another aspect of the present invention, a NAND memory array is formed using separated sidewall select gates where the sidewall portions are isolated. In this manner, the sidewall select gates are shared between adjacent floating gates and no spacer is required. Thus, the size of the memory cell can be reduced. FIG. 24 illustrates a cross-sectional view of a series of memory cells with separated sidewall select gates. In the present description, the schematic symbol of a memory cell using separated sidewall portions as the select gate is shown in FIG. 25.

Figure 26:
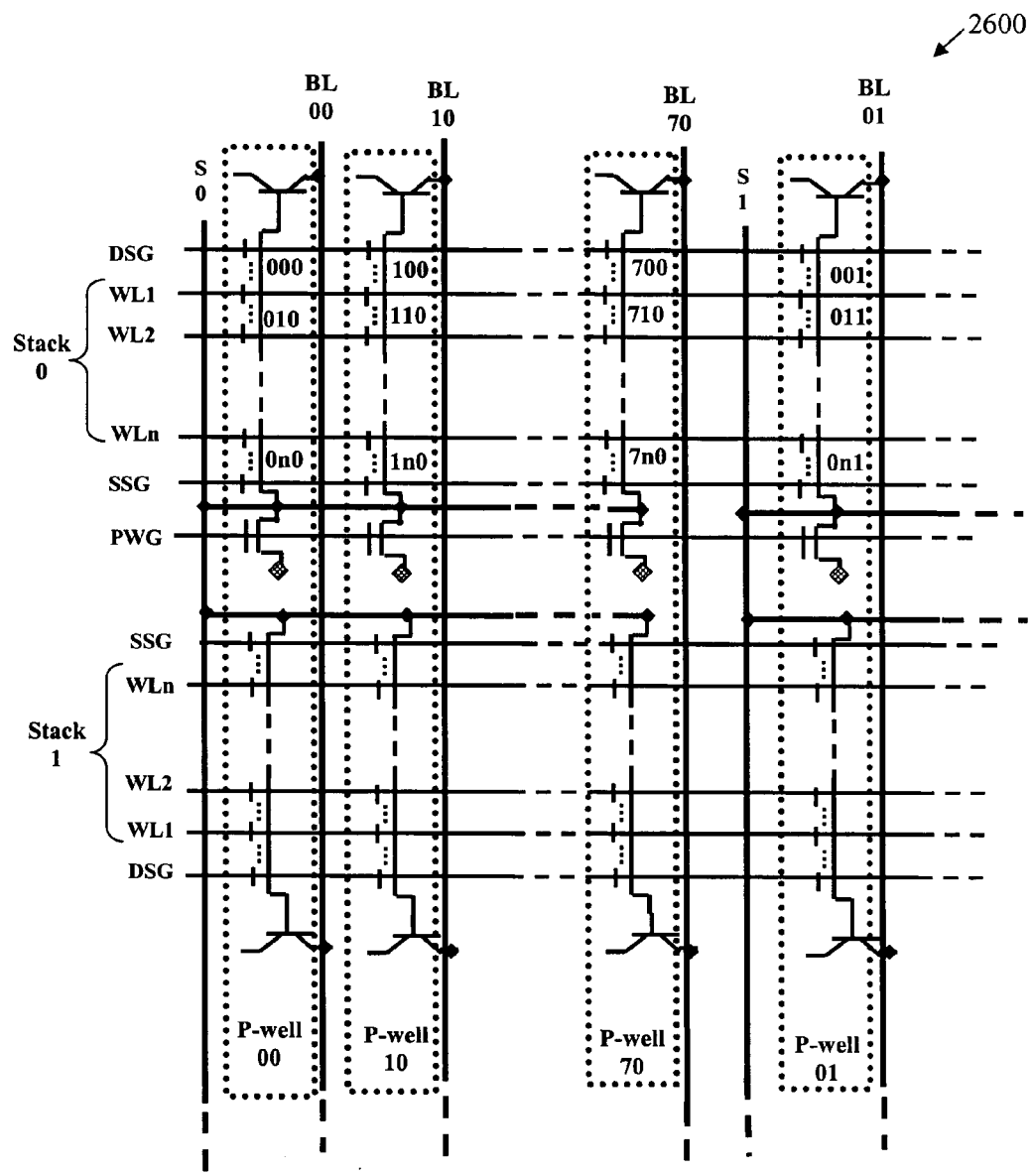
FIG. 26 is a schematic diagram of a NAND memory array implemented using a separated sidewall select gate in the memory transistor and with IGBTs according to one embodiment of the present invention.

FIG. 26 is a schematic diagram of a NAND memory array implemented using a separated sidewall select gate in the memory transistor and with IGBTs according to one embodiment of the present invention. Of course, the NAND memory array in FIG. 26 can also be implemented without using the IGBTs when increased cell read current is not necessary.

Figure 27:
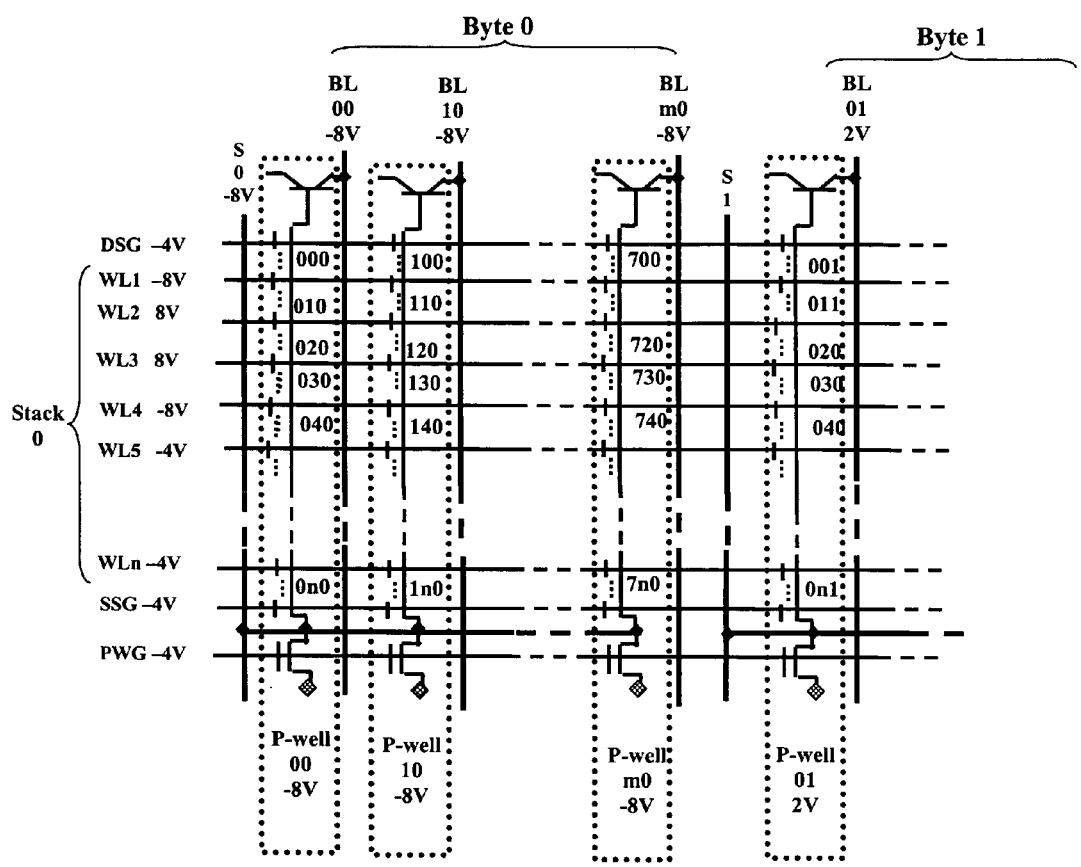
FIG. 27 shows the write conditions of the memory cells in the memory array of FIG. 26.

FIG. 27 shows the write conditions of the memory cells in memory array 2600 of FIG. 26. In this illustration, memory cells of byte 02 between wordline 2 (WL2) and wordline 3 (WL3) are being written. The portion of the voltage applied to the select gates coupled to the floating gate is:

$$V_{fg} = k * V_{sg},$$

with $k$ = Gate Coupling Ratio per side $$= Csw/(Csw + Ctu),$$

where Csw is the sidewall capacitance between the select and floating gate and Ctu is the capacitance of the tunnel oxide area under the floating gate.

In the memory cell, the voltage on the floating gate is the result of the voltage due to the stored charge and the voltage coupled by the select gates on the sidewall portions $V_{cgleft}$ and $V_{cgright}$. Referring the voltages to the P-well and using the values shown in FIG. 27, the voltage at the floating gate is:

$$V_{fg} = Q_{fg}/C_{tot} + k * [(V_{cgleft} - V_{pwell}) + (V_{cgright} - V_{pwell})]$$

$$= Q_{fg}/C_{tot} + k * 32 \text{ V}.$$

For this type of memory cell, k is around 0.4 and the voltage across the tunnel oxide for the cell to be written is over 12 V assuming that the cell is erased ($Q_{fg}$ zero or positive). This $V_{fg}$ voltage is more than adequate for FN tunneling.

For the other memory cells of the stack, the floating gate voltages, assuming zero $Q_{fg}$, are:

$V_{fg}$=k* 16 V for cell 010 and 030;

$V_{fg}$=k* 4 V for cells 000 and 040;

$V_{fg}$=k* 8 V for the remaining non-elected cells of the selected byte.

These voltages are not enough for tunneling.

Tunneling in the memory cells of the selected row belonging to the non-selected byte (byte 1) is prevented because the inhibit voltage (2V) is applied to the P-wells of the byte.

During writing as well as during erase, the voltage across the gate oxide of the select gates surrounding the floating gate to be written or erased is the full Vpp (16V). The thickness of this gate oxide is adjusted to a value around 250 Å for insuring the reliability of the oxide.

During writing there is no reverse bias on any junction, except between the Deep N-well (which has to be set at 2V) and the P-wells of the selected byte (at −8V). This voltage difference of 10V can be easily sustained by the P-well/Deep N-well junction.

Figure 28:
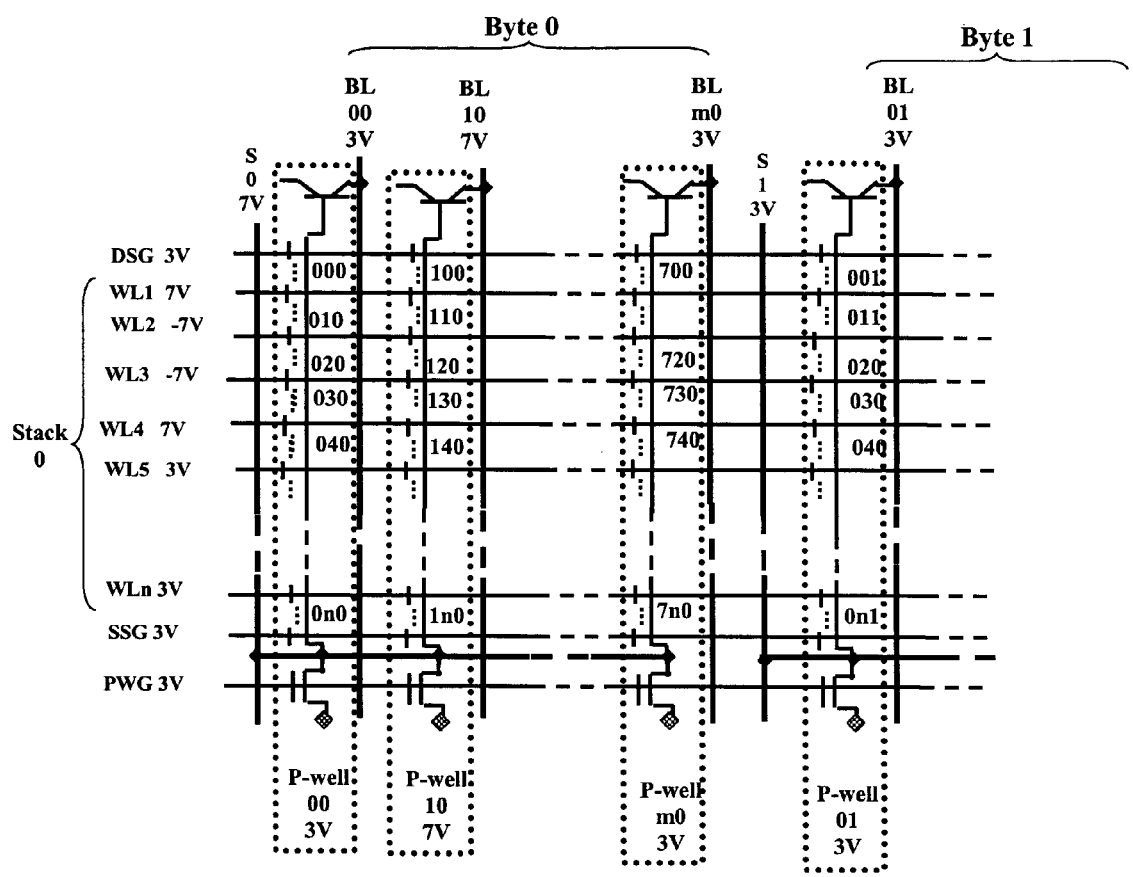
FIG. 28 illustrates the erase conditions of the memory array of FIG. 26 for erasing memory cell 120 in stack 0, BL10 and between WL20 and WL30.

Erase operation of memory array 2600 is a selective operation and FIG. 28 illustrates the erase conditions of memory array 2600 for erasing memory cell 120 in stack 0, BL10 and between WL20 and WL30. Erase is obtained by FN tunneling of electrons from the floating gate to the accumulated P-well. The floating gate voltage is enough for FN tunneling only on the target cell and voltage $V_{fg}$ for all the other cells of the selected byte is way below the value required for tunneling. Beside the P-well/Deep-N-well junction (which has 4V of reverse bias), there is a reverse bias of 4V between the common source S0 of the selected byte and the P-wells of the non selected bits of the selected byte. The Source to P-well junction can easily sustain this modest reverse bias.

Figure 29:
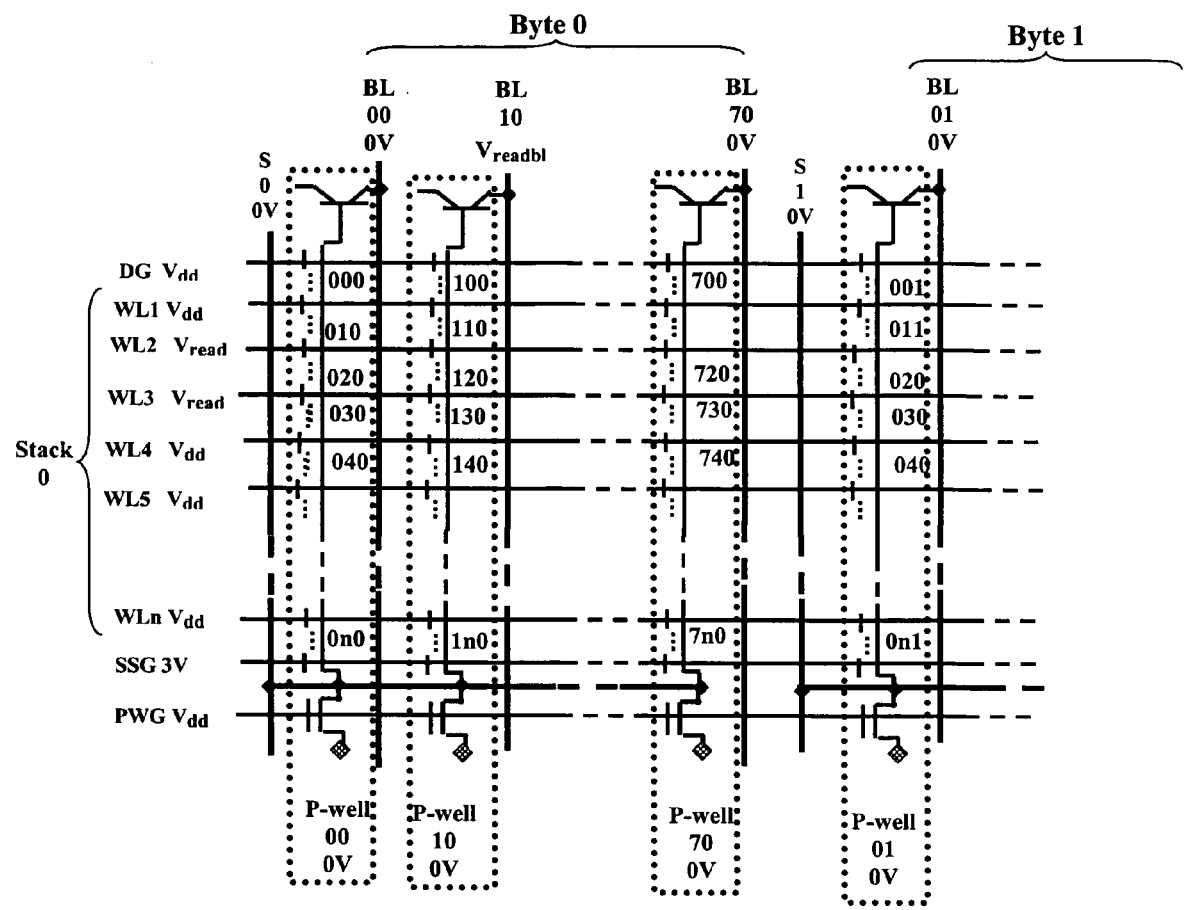
FIG. 29 illustrates the read conditions of the memory array of FIG. 26 for reading cell 120.

FIG. 29 illustrates the read conditions of memory array 2600 for reading cell 120. $V_{readbl}$ is the voltage used on the bitline for reading (around 0.9V) and $V_{read}$ is the voltage applied to the select gates of the target cell. Vdd is the supply voltage which depends on the technology.

In the following description, the following definitions are used:

$V_{tfgw}$=Threshold voltage of a written cell measured at the floating gate;

$V_{tfge}$=Threshold voltage of an erased cell measured at the floating gate;

$\Delta V_{fgoff}$=Voltage decrease below threshold required for turning off the floating gate transistor;

$V_{tsg}$=Threshold voltage of the select transistors; and $\Delta V_{sgon}$=Overdrive of the select gate transistor.

The floating gate voltage is created by the capacitive coupling of the left and right select gates according to:

$$V_{fg}=k*(V_{sgl}+V_{sgr}).$$

Figure 30:
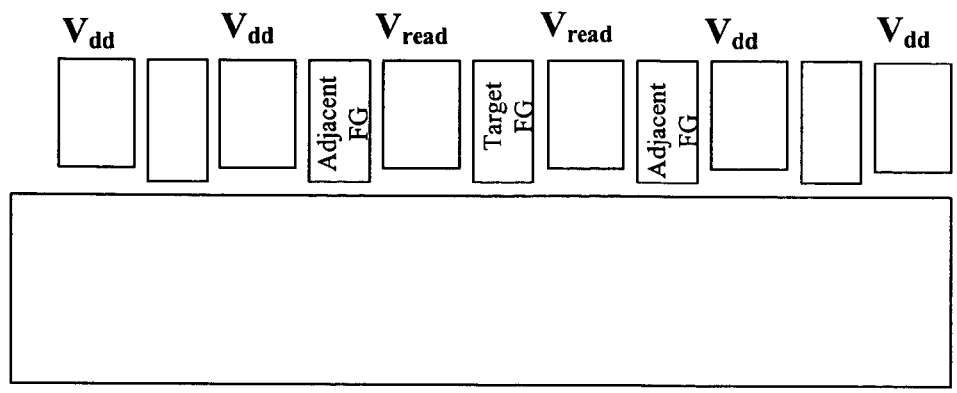
FIG. 30 illustrates the voltages for the read operation of the memory array of FIG. 26.
Figure 31:
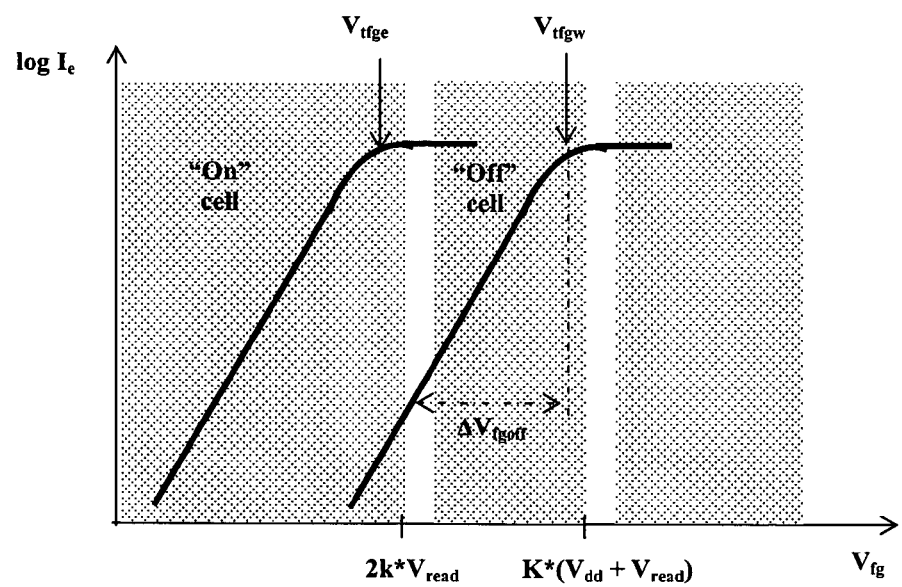
FIG. 31 illustrates the response to the applied voltages of the memory array of FIG. 26.

The voltages for read are shown in the simplified diagram of FIG. 30 and the response to the applied voltages is shown in FIG. 31.

The conditions for proper read operation are now described. $V_{read}$ has to be above the threshold of the select transistors surrounding the target cell by the amount required for the gate overdrive:

$$V_{read}=V_{tsg}+\Delta V_{sgon}. \quad \text{(Eq. 1)}$$

The voltage induced in the target floating gate has to be below the lower limit of the written threshold by the amount required for the turnoff of a cell:

$$V_{fgread}=2k*V_{read}=V_{tfgw}-\Delta V \quad \text{(Eq. 2)}$$

From (1) and (2), the following is derived:

$$V_{tfgw}=2k*V_{tsg}+2k*\Delta V_{sgon}+\Delta V_{fgoff} \quad \text{(Eq. 3)}$$

Equation (3) states that the minimum written threshold is fixed by the technology and is independent of Vdd. The voltage induced in the adjacent floating gate has to be above the upper limit of the written threshold by the amount required for the overdrive:

$$V_{fgadj}=k*(V_{read}+V_{dd})=V_{tfgw}+\Delta V_{fgon}. \quad \text{(Eq. 4)}$$

From (4) and (1) the minimum Vdd for proper operation is then given as:

$$V_{ddmin}=V_{tsg}+2*V_{sgon}+\Delta V_{fgoff}/k \quad \text{(Eq. 5)}$$

The parameters $V_{tsg}$, $\Delta V_{fgoff}$ and $\Delta V_{sgon}$ are technology dependent and once they are established $V_{ddmin}$ and $V_{read}$ can be calculated.

The calculations made assuming typical values for the parameters indicates that: (1) it is possible to read the memory cell with a Vdd as low 1.8 V; (2) a cell current of 20 μA for a cell drawn with 0.18 um design rules can be easily obtained and that the MOS current in the stack is a fraction of a micro-amps; and (3) the cell current is almost independent of Vdd.

The result that the cell current is independent of Vdd is true for all the NAND arrays which use the IGBT described before. This property is very attractive for making memory cells capable of storing more than one bit (multilevel storage).

Figure 32:
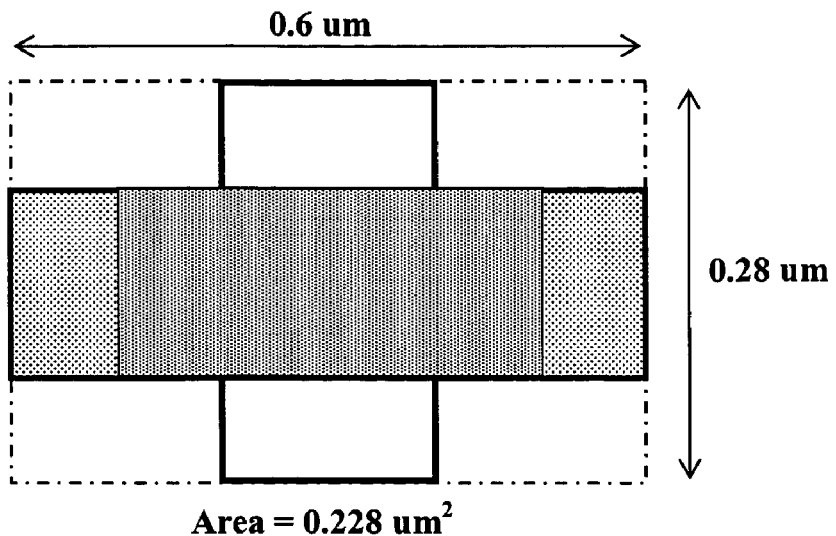
FIG. 32 is a layout of a self-aligned stacked gate cell which is used in the memory arrays in FIGS. 13 and 18.
Figure 33:
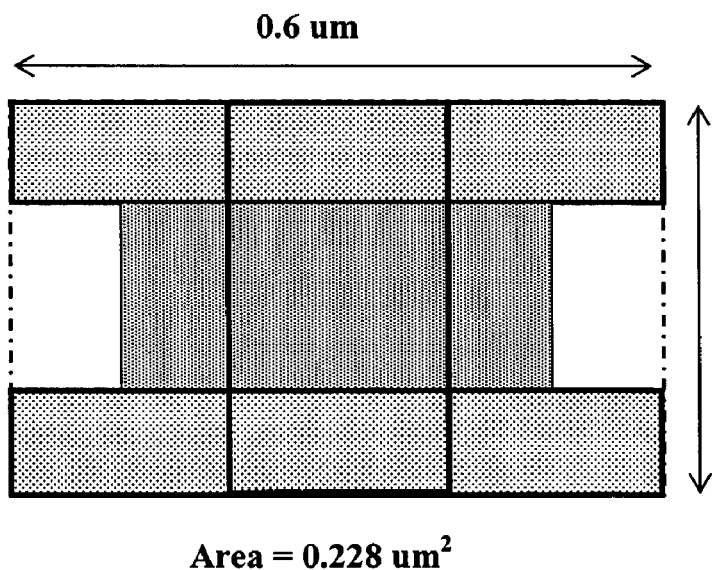
FIG. 33 is a layout of a memory cell with separated sidewall select gate which is used in the memory array of FIG. 26.
Figure 34:
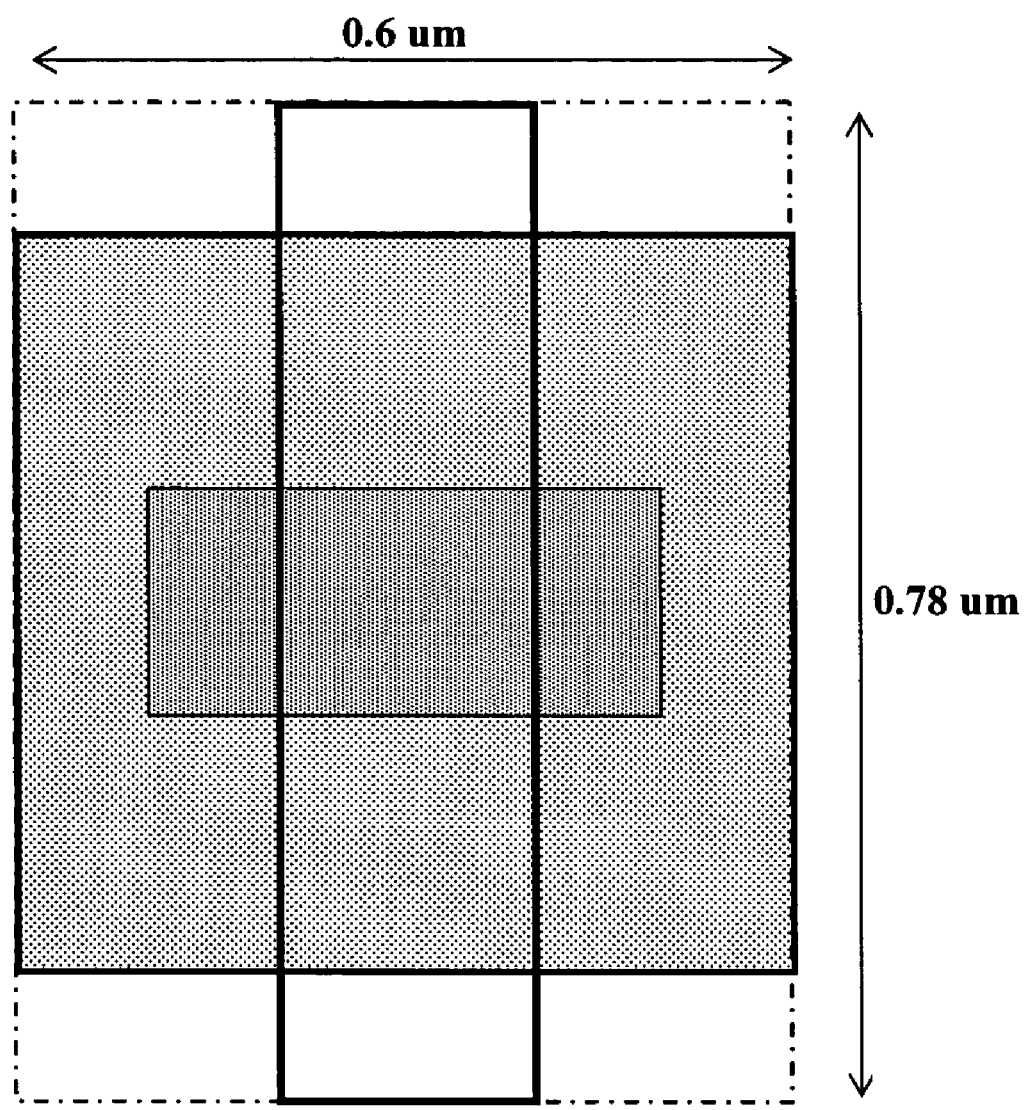
FIG. 34 is a layout of a memory cell with sidewall select gate with sidewall portions shorted together which is used in the memory arrays in FIGS. 20 and 23.

FIGS. 32–34 illustrate the layout schematics of three types of memory cells used in the NAND arrays described above. The dimensions used in the figures are typical of a 0.18 μm technology. FIG. 32 is a layout of a self-aligned stacked gate cell which is used in arrays 1300 and 1800 in FIGS. 13 and 18. FIG. 33 is a layout of a memory cell with separated sidewall select gate which is used in array 2600 of FIG. 26. FIG. 34 is a layout of a memory cell with sidewall select gate with sidewall portions shorted together. The memory cell is used in array 2000 and 2300 of FIGS. 20 and 23.

These memory cells are significantly smaller than the cell used in the Common Source NOR array (0.67 um² for 0.18 um rules). In the NAND arrays, particularly for the ones which use the IGBT, the number of cells in a sector or a stack can be quite large, such as 64 cells. The overhead created by the addition of the IGBT, the Source select transistor and the device for grounding the source (PWG transistor) increases the effective size of the memory cell by les than 10%.

The above detailed descriptions are provided to illustrate specific embodiments of the present invention and are not intended to be limiting. Numerous modifications and variations within the scope of the present invention are possible. For example, the above description concerns the formation of a memory cell using an NMOS transistor. One of ordinary skill in the art would appreciate that the memory array of the present invention can also be implemented using a PMOS transistor in the memory cell with the appropriate reversal of conductivity types (p-type or n-type) used to form the memory array and the appropriate reversal of the applied operation voltages. Furthermore, when IGBTs are incorporated in the memory array for increasing cell read currents, the IGBT can be a PNP transistor when NMOS memory transistor is used or the IGBT can be an NPN transistor when PMOS memory transistor is used. The present invention is defined by the appended claims.

I claim:

1. A non-volatile memory array including memory cells arranged in rows and columns, the memory array comprising:

a plurality of control lines each associated with one of the rows of the memory array;

a plurality of bitlines each associated with one of the columns of the memory array;

a plurality of source lines each associated with a group of the columns of the memory array;

a plurality of well regions of a first conductivity type formed in a semiconductor layer of a second conductivity type, each well region being spaced apart and electrically isolated;

a plurality of memory cells arranged in rows and columns, each column of memory cells being positioned within one of the plurality of well regions, the columns of the memory cells being divided into a plurality of groups and the rows of the memory cells being divided into a plurality of sectors, each memory cell comprising:

a memory transistor formed in the respective well region, the memory transistor comprising a source, a drain, and a floating gate formed over a channel of the memory transistor; and a control/select gate coupled between a respective control line and the floating gate of the memory transistor;

a plurality of drain select transistors and a plurality of drain select lines, each drain select transistor being provided for a sector of memory cells in each column of memory cells and having a drain coupled to a respective bitline, a source and a gate, the gate of each drain select transistor being coupled to a respective drain select line; and a plurality of source select transistors and a plurality of source select lines, each source select transistor being associated with a sector of memory cells in each column of memory cells and having a drain, a source and a gate, the gate being coupled to a respective source select line, wherein the sources of the source select transistors associated with each group of memory cells are connected together and to a respective source line and are electrically isolated from the sources of the source select transistors associated with other groups of memory cells, the sources of the source select transistors forming a p-n junction with the respective underlying well regions, wherein the memory transistors in a sector of memory cells within a column are connected in series between a respective drain select transistor and a respective source select transistor; and wherein each memory cell in the memory array is programmed and erased by tunneling of electrons between the floating gate and the channel of each memory transistor.

2. The memory array of claim 1, wherein the control/select gate comprises a control gate and the memory transistor and the control gate are formed as a self-aligned stacked gate memory transistor.

3. The memory array of claim 1, wherein the control/select gate comprises a select gate and the select gate is formed as a separated sidewall select transistor on the sidewalls of the floating gate and insulated from the floating gate in the memory transistor, the separated sidewall select transistor comprising a first portion formed on a first sidewall of the floating gate and a second portion formed on a second sidewall of the floating gate, the first portion and the second portion being electrically insulated.

4. The memory array of claim 1, wherein each memory cell comprises a memory bit and each group of memory cells comprises a memory byte.

5. The memory array of claim 4, wherein the memory array is programmed by writing a memory byte at a time and the memory array is erased by erasing a memory bit at a time.

6. The memory array of claim 1, further comprising:

a plurality of insulated gate bipolar transistors (IGBTs), each IGBT being provided for a sector of memory cells in each column of memory cells, wherein each IGBT comprises an emitter coupled to a respective bit line, a base coupled to the drain of the respective drain select transistor for the sector of memory cells and a collector formed by the well region associated with the memory cells.

7. The memory array of claim 6, further comprising:

a plurality of well transistors and a plurality of well transistor control lines, each well transistor being provided for two adjacent sectors of memory cells in each column of the memory cells, wherein each well transistor comprises a drain and a source both being coupled to the source of the respective source select transistor and a gate being coupled to a respective well transistor control line.

8. The memory array of claim 6, wherein a current during the reading of the memory cell is independent of the voltage on the control line applied to the memory cell.

9. The memory array of claim 1, wherein the first conductivity type comprises P-type and the second conductivity type comprises N-type and the memory transistor comprises an NMOS transistor.

10. The memory array of claim 9, wherein the semiconductor layer comprises a deep N-well formed in a P-type semiconductor substrate and the plurality of well regions comprises a plurality of P-well regions formed in the deep N-well.

11. A non-volatile memory array including memory cells arranged in rows and columns, the memory array comprising:

a plurality of control lines each associated with one of the rows of the memory array;

a plurality of bitlines each associated with one of the columns of the memory array;

a plurality of source lines each associated with a group of the columns of the memory array;

a plurality of well regions of a first conductivity type formed in a semiconductor layer of a second conductivity type, each well region being spaced apart and electrically isolated;

a plurality of memory cells arranged in rows and columns, each column of memory cells being positioned within one of the plurality of well regions, the columns of the memory cells being divided into a plurality of groups and the rows of the memory cells being divided into a plurality of sectors, each memory cell comprising:

a memory transistor formed in the respective well region, the memory transistor comprising a source, a drain, and a floating gate formed over a channel of the memory transistor; and a select gate coupled between a respective control line and the floating gate of the memory transistor, wherein the memory transistors in a sector of memory cells within a column are connected in series between a first memory transistor and a last memory transistor, the drain of the first memory transistor being coupled to a respective bitline, the sources of the last memory transistors associated with each group of memory cells are connected together and to the respective source line and are electrically isolated from the sources of the last memory transistors associated with other groups of memory cells, the sources of the last memory transistors forming a p-n junction with the respective underlying well regions, wherein each memory cell in the memory array is programmed and erased by tunneling of electrons between the floating gate and the channel of each memory transistor.

12. The memory array of claim 11, wherein the select gate comprises a select transistor formed adjacent the memory transistor.

13. The memory array of claim 11, wherein the select gate comprises a sidewall select transistor formed on the sidewalls of the floating gate and insulated from the floating gate in the memory transistor.

14. The memory array of claim 13, wherein the sidewall select transistor comprises sidewall portions that are electrically shorted to each other.

15. The memory array of claim 11, wherein each memory cell comprises a memory bit and each group of memory cells comprises a memory byte.

16. The memory array of claim 15, wherein the memory array is programmed by writing a memory byte at a time and the memory array is erased by erasing a memory bit at a time.

17. The memory array of claim 11, further comprising:
a plurality of insulated gate bipolar transistors (IGBTs), each IGBT being provided for a sector of memory cells in each column of memory cells, wherein each IGBT comprises an emitter coupled to a respective bit line, a base coupled to the drain of the respective first memory transistor for the sector of memory cells and a collector formed by the well region associated with the memory cells.

18. The memory array of claim 17, further comprising:
a plurality of well transistors associated with columns of the memory cells and a plurality of well transistor control lines, each well transistor being provided for two adjacent sector of memory cells in each column of memory cells, wherein each well transistors comprises a drain and a source both coupled to the source of the respective last memory transistor and a gate coupled to a respective well transistor control line.

19. The memory array of claim 17, wherein a current during the reading of the memory cell is independent of the voltage on the control line applied to the memory cell.

20. The memory array of claim 11, wherein the first conductivity type comprises P-type and the second conductivity type comprises N-type and the memory transistor comprises an NMOS transistor.

21. The memory array of claim 20, wherein the semiconductor layer comprises a deep N-well formed in a P-type semiconductor substrate and the plurality of well regions comprises a plurality of P-well regions formed in the deep N-well.

* * * * *